United States Patent
Arai et al.

(10) Patent No.: US 9,778,085 B2
(45) Date of Patent: Oct. 3, 2017

(54) FLOW SENSOR WITH A PROTRUDING PORTION FOR HEIGHT CONTROL AND A COVER FOR SUPPRESSING SINKING OF THE COVER DURING WELDING

(71) Applicant: Hitachi Automotive Systems, Ltd., Hitachinaka-shi, Ibaraki (JP)

(72) Inventors: Satoshi Arai, Tokyo (JP); Shigeharu Tsunoda, Tokyo (JP); Shinobu Tashiro, Hitachinaka (JP); Akira Uenodan, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/027,564

(22) PCT Filed: Nov. 4, 2014

(86) PCT No.: PCT/JP2014/079249
§ 371 (c)(1),
(2) Date: Apr. 6, 2016

(87) PCT Pub. No.: WO2015/072371
PCT Pub. Date: May 21, 2015

(65) Prior Publication Data
US 2016/0252379 A1    Sep. 1, 2016

(30) Foreign Application Priority Data
Nov. 14, 2013    (JP) .................................. 2013-235867

(51) Int. Cl.
*G01F 1/68*    (2006.01)
*G01F 1/684*    (2006.01)
(Continued)

(52) U.S. Cl.
CPC ........ *G01F 1/6847* (2013.01); *B29C 65/1616* (2013.01); *B29C 65/1635* (2013.01);
(Continued)

(58) Field of Classification Search
CPC ............. F02D 41/187; F02D 2041/283; F02D 41/2474; F02D 2200/0414; G01F 1/6845;
(Continued)

(56) References Cited

U.S. PATENT DOCUMENTS

| 6,789,418 B2* | 9/2004 | Uramachi | G01F 1/684 73/204.22 |
| 7,712,361 B2* | 5/2010 | Uramachi | G01F 1/6842 73/204.22 |

(Continued)

FOREIGN PATENT DOCUMENTS

| JP | 11-258019 A | 9/1999 |
| JP | 2008-32539 A | 2/2008 |

(Continued)

OTHER PUBLICATIONS

International Search Report (PCT/ISA/210) issued in PCT Application No. PCT/JP2014/079249 dated Dec. 9, 2014 with English translation (5 pages).

(Continued)

Primary Examiner — Harshad R Patel
Assistant Examiner — Brandi Hopkins
(74) Attorney, Agent, or Firm — Crowell & Moring LLP

(57) ABSTRACT

A flow rate sensor includes: a housing made from a resin material and having a bottom base portion and a side wall, at least one surface side of the housing being open; a cover made from a resin material, covering the one surface side of the housing, welded to an upper surface of the side wall of the housing, and defining, with the bottom base portion and the side wall of the housing, an auxiliary passage within (Continued)

which a gas to be measured flows that is taken in from a main passage; and a flow rate detection unit disposed within the auxiliary passage. A protruding portion for height control is provided to one of the housing and the cover at least in a vicinity of the side wall around the flow rate detection unit so as to suppress sinking in of the cover during welding.

20 Claims, 22 Drawing Sheets

(51) Int. Cl.
| | | |
|---|---|---|
| *B29C 65/16* | (2006.01) | |
| *B29C 65/78* | (2006.01) | |
| *B29C 65/00* | (2006.01) | |
| *B29L 31/34* | (2006.01) | |
| *B29C 65/08* | (2006.01) | |
| *B29C 65/02* | (2006.01) | |
| *B29C 65/06* | (2006.01) | |

(52) U.S. Cl.
CPC ...... *B29C 65/1661* (2013.01); *B29C 65/7829* (2013.01); *B29C 66/112* (2013.01); *B29C 66/114* (2013.01); *B29C 66/242* (2013.01); *B29C 66/244* (2013.01); *B29C 66/32* (2013.01); *B29C 66/53462* (2013.01); *B29C 66/73161* (2013.01); *G01F 1/684* (2013.01); *B29C 65/02* (2013.01); *B29C 65/06* (2013.01); *B29C 65/08* (2013.01); *B29C 65/1677* (2013.01); *B29C 66/71* (2013.01); *B29C 66/73772* (2013.01); *B29C 66/73774* (2013.01); *B29C 66/73921* (2013.01); *B29C 66/8122* (2013.01); *B29C 66/81267* (2013.01); *B29C 66/929* (2013.01); *B29L 2031/3481* (2013.01)

(58) Field of Classification Search
CPC .......... G01F 15/04; G01F 1/696; G01F 1/698; G01F 15/006; G01F 1/6842; G01F 15/02; G01F 5/00; G01F 1/6965; G01F 1/699; G01F 15/043; G01F 1/684; G01F 1/692; F02M 35/021; G01P 5/12
USPC .................. 73/204.22, 118.2, 756, 202.5
See application file for complete search history.

(56) References Cited

U.S. PATENT DOCUMENTS

| | | |
|---|---|---|
| 2008/0261065 A1 | 10/2008 | Fujimoto et al. |
| 2011/0296904 A1 | 12/2011 | Tagawa et al. |
| 2015/0000395 A1* | 1/2015 | Tashiro ................ F02D 41/182 |
| | | 73/204.26 |

FOREIGN PATENT DOCUMENTS

| | | |
|---|---|---|
| JP | 2008-265163 A | 11/2008 |
| JP | 2010-162587 A | 7/2010 |
| JP | 2011-252796 A | 12/2011 |
| JP | 2013-170915 A | 9/2013 |
| WO | WO 2008/001583 A1 | 1/2008 |

OTHER PUBLICATIONS

Japanese-language Written Opinion (PCT/ISA/237) issued in PCT Application No. PCT/JP2014/079249 dated Dec. 9, 2014 (4 pages).
Extended European Search Report issued in counterpart European Application No. 14861709.5 dated Mar. 30, 2017 (Seven (7) pages).

* cited by examiner

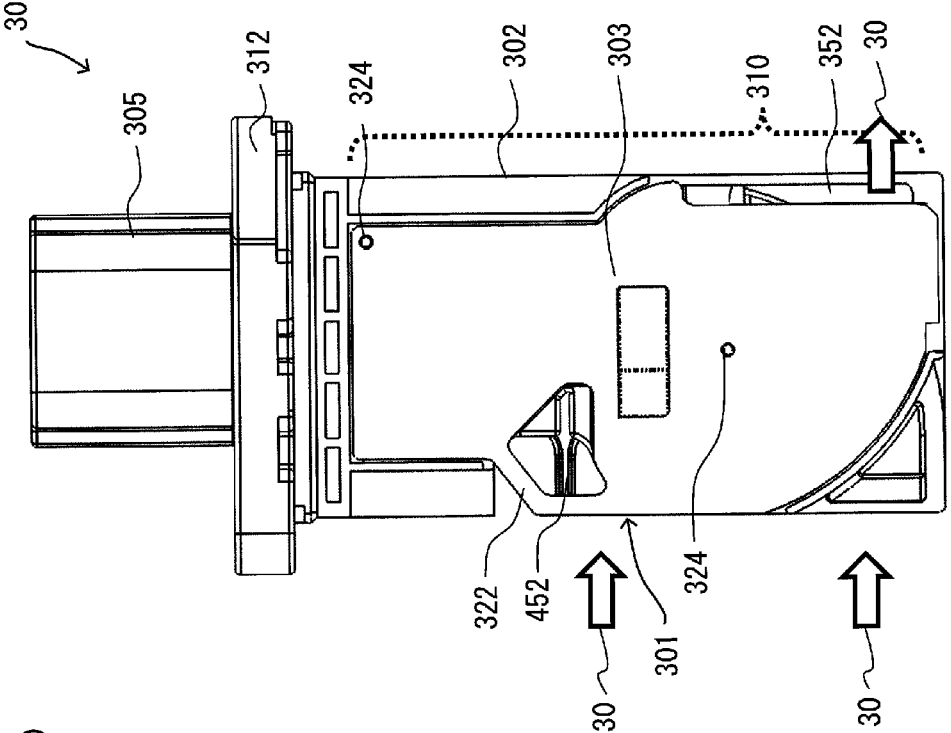
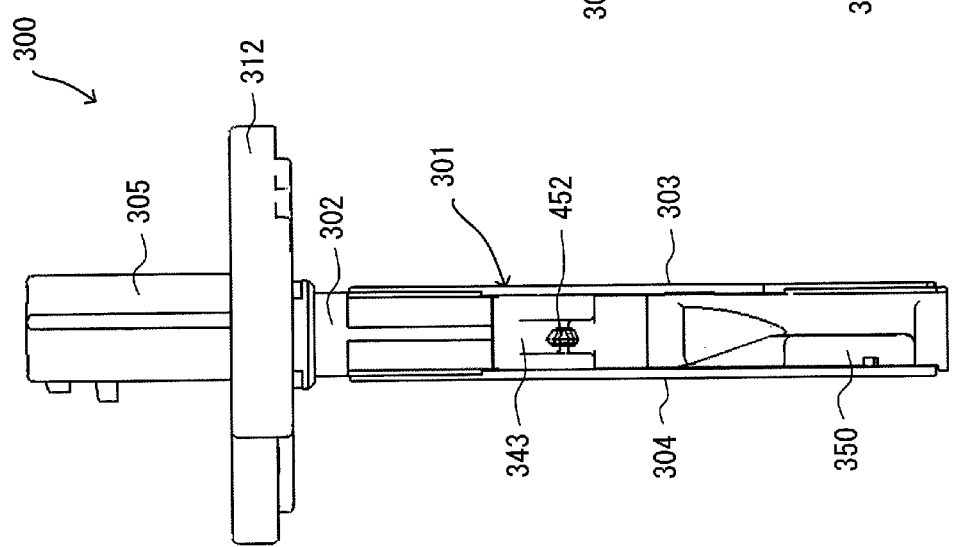

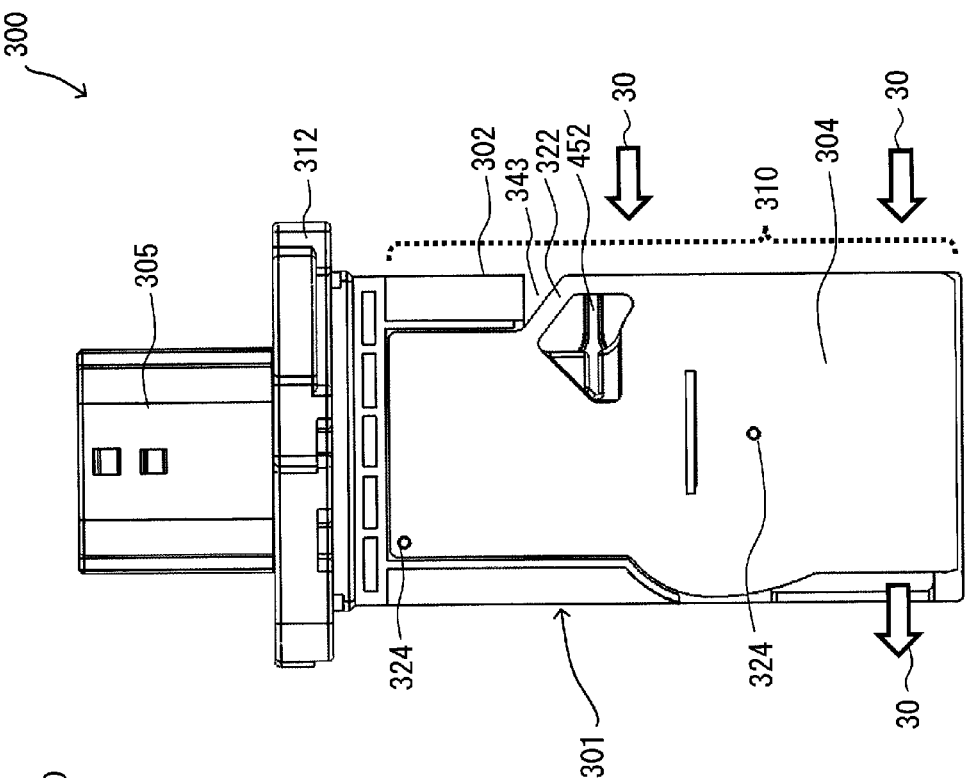
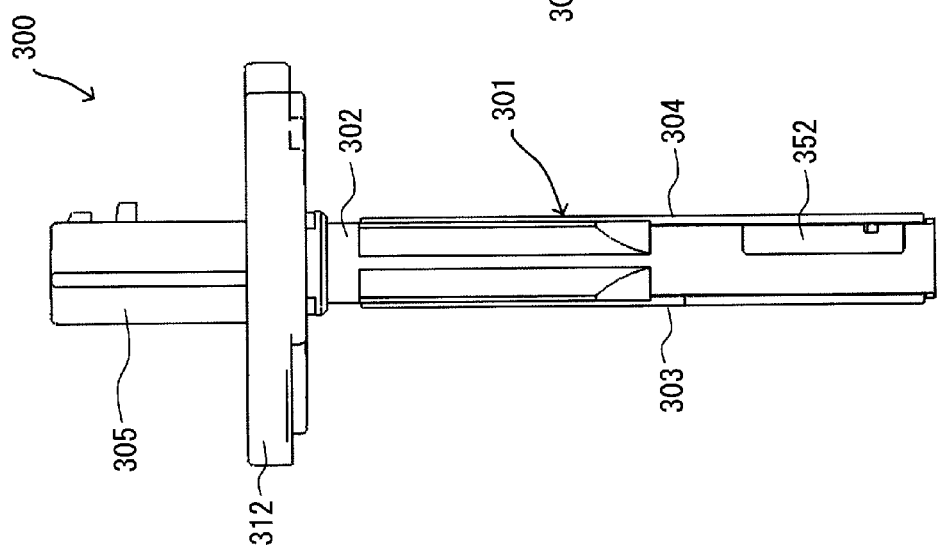

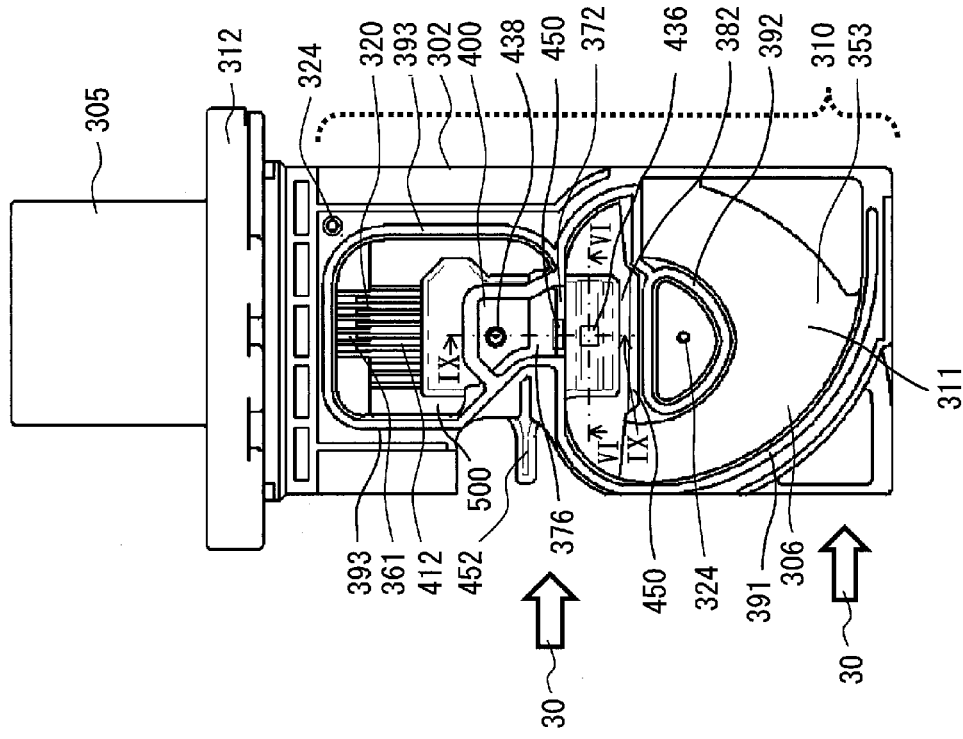
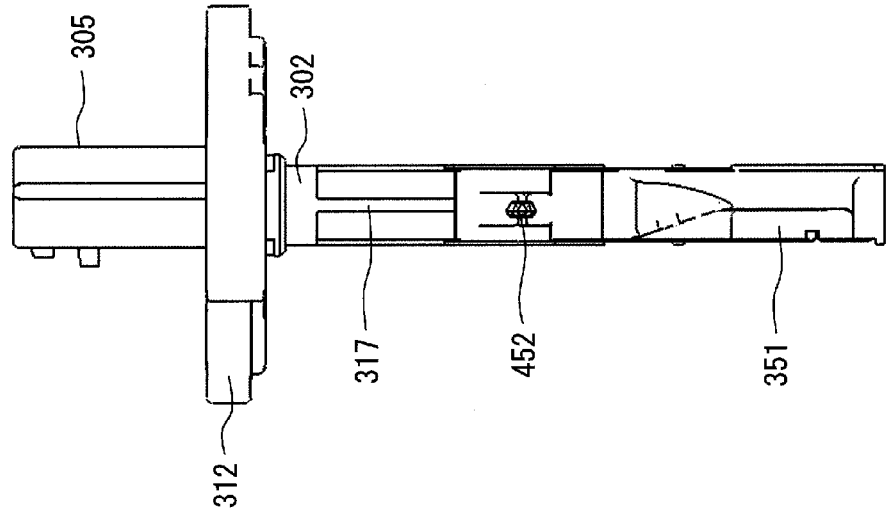

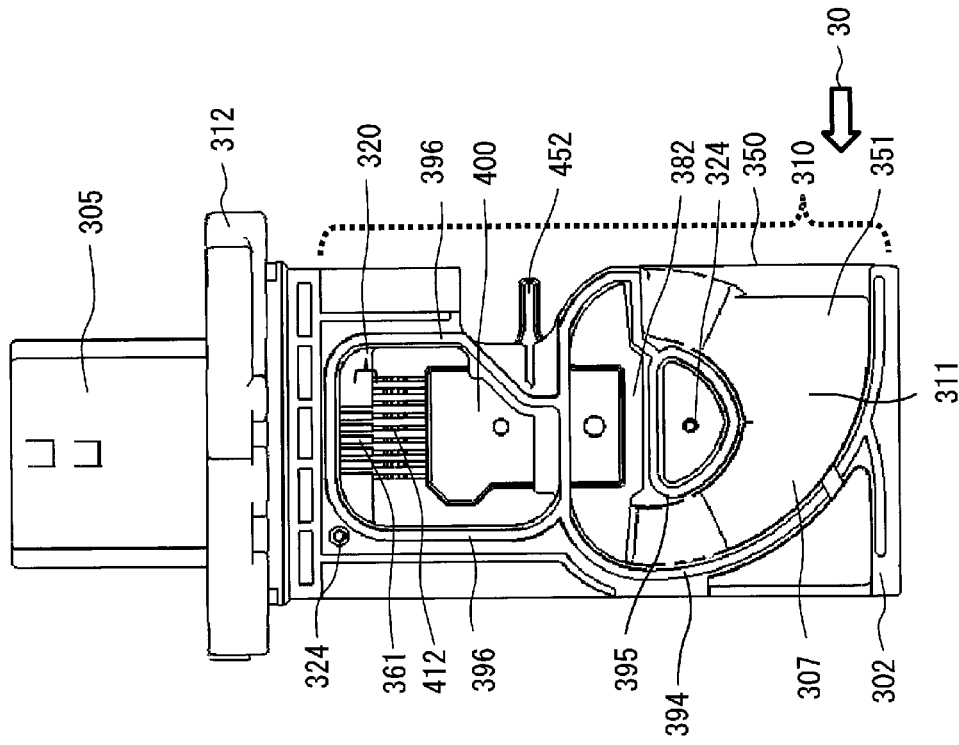
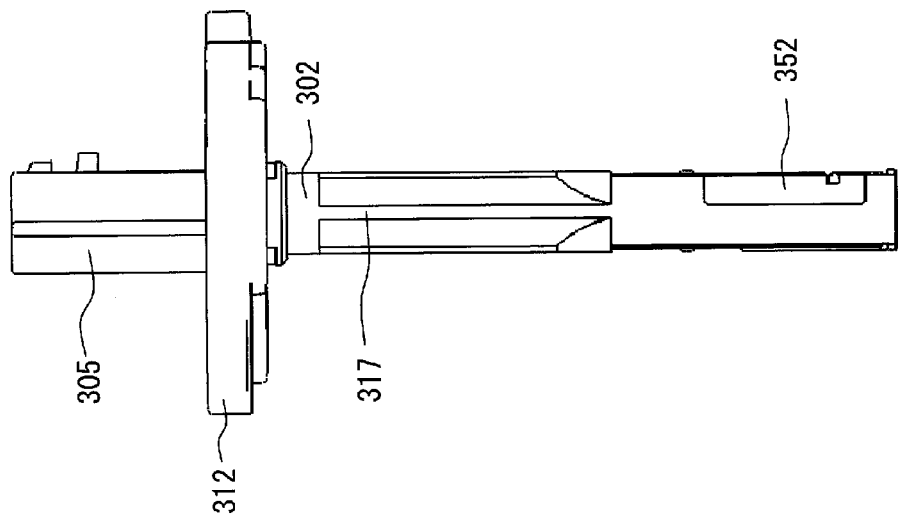
FIG. 5A
FIG. 5B

FIG. 8C
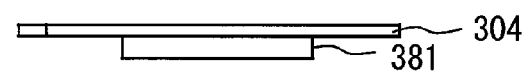
FIG. 8A
FIG. 8B
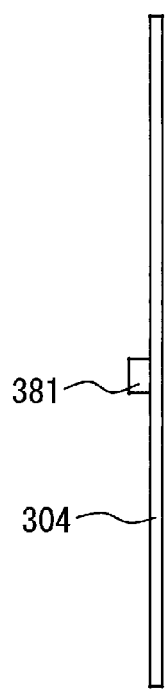
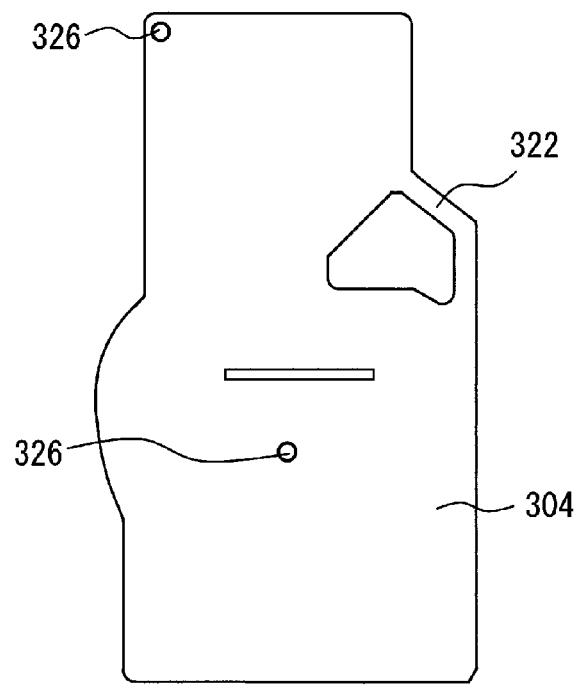

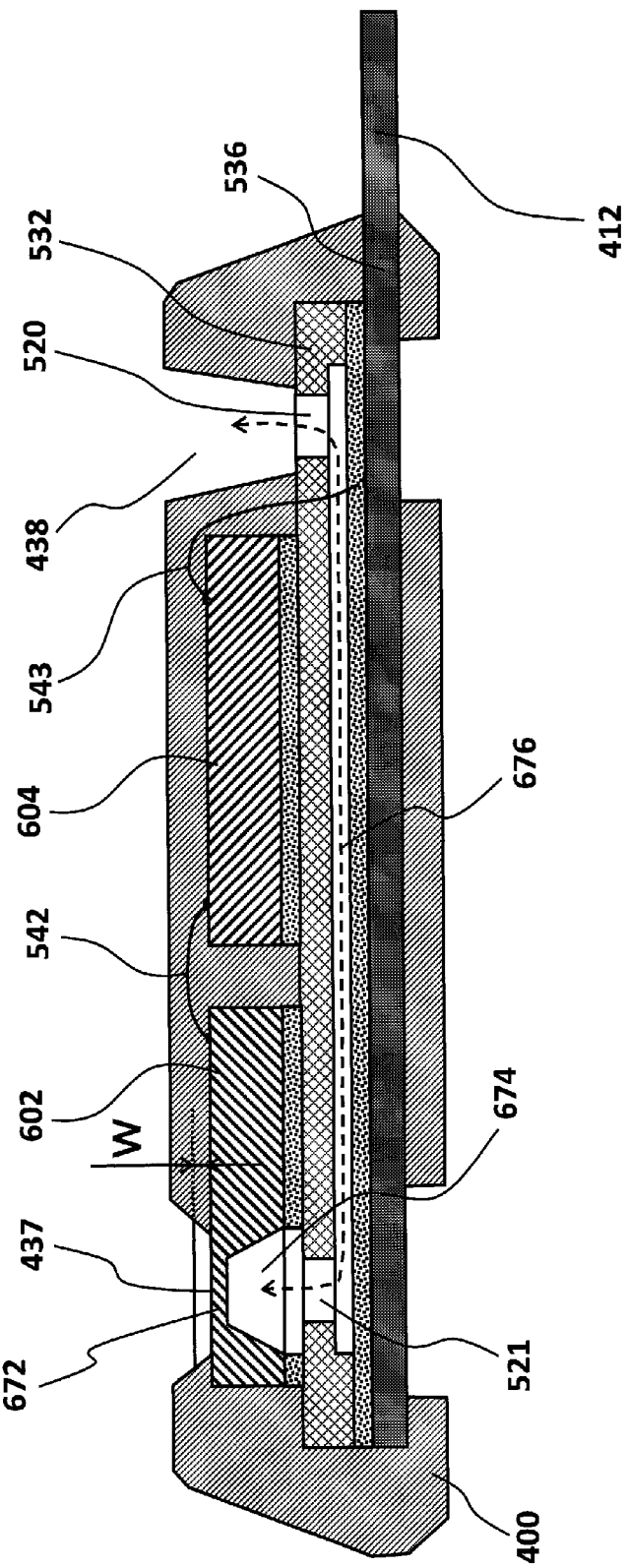

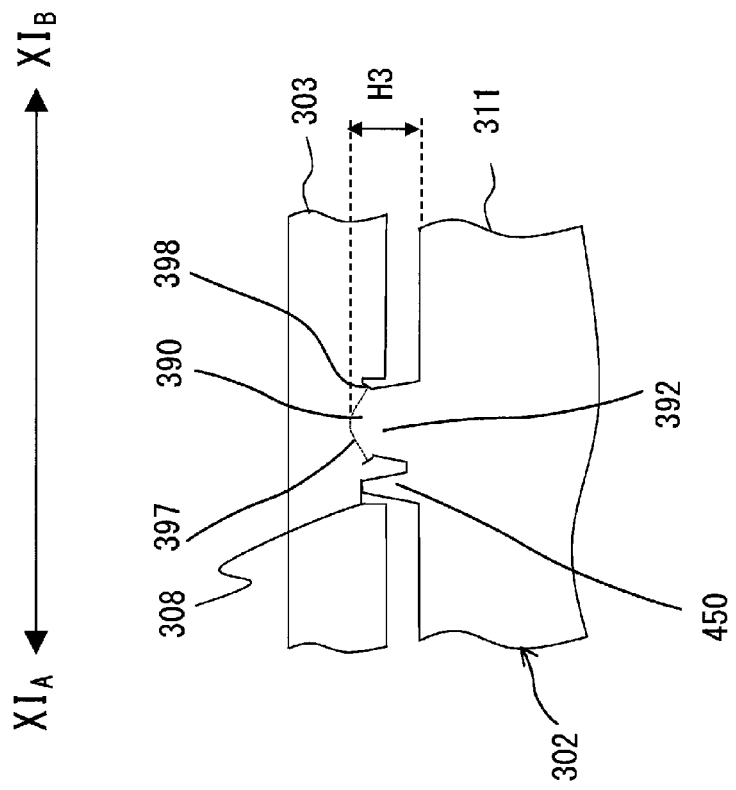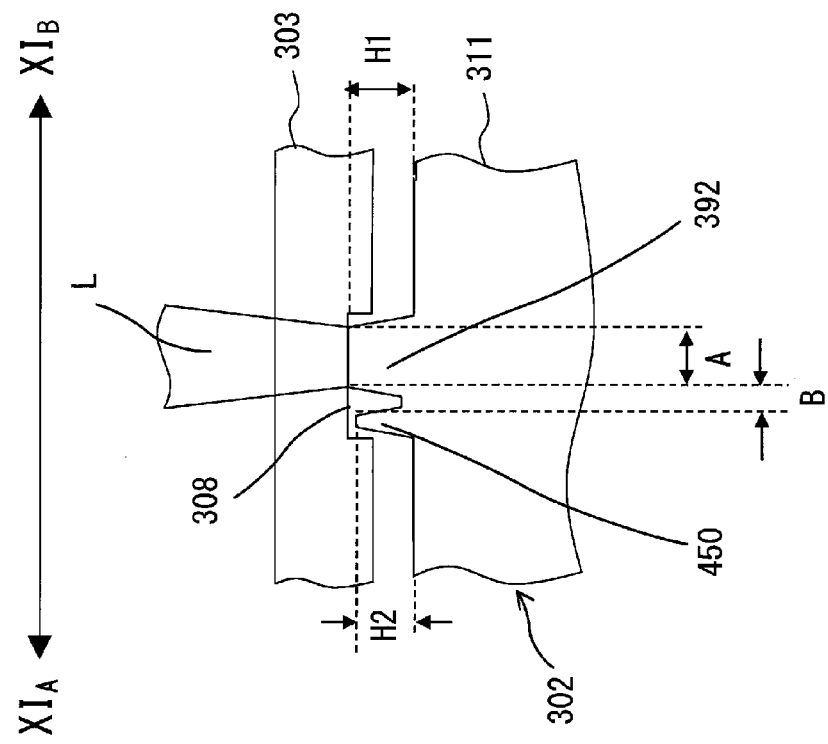

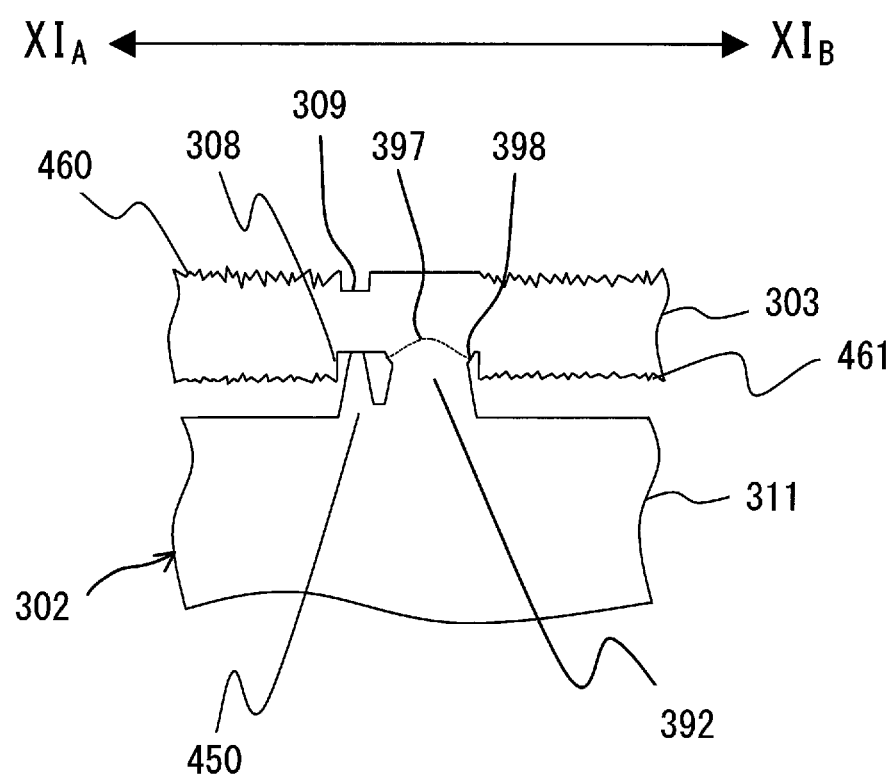

FLOW SENSOR WITH A PROTRUDING PORTION FOR HEIGHT CONTROL AND A COVER FOR SUPPRESSING SINKING OF THE COVER DURING WELDING

TECHNICAL FIELD

The present invention relates to a flow rate sensor, and in more detail relates to a flow rate sensor having a casing that is made by welding together a housing and a cover.

BACKGROUND ART

As a flow rate sensor that measures the flow rate of a gas, a sensor that includes a flow rate detection unit for measuring the flow rate is known. Such a flow rate sensor is adapted to measure the flow rate of the gas by performing transmission of heat between the flow rate detection unit and the gas to be measured, which is the subject of measurement. Flow rates that are measured by such flow rate sensors are widely employed as important control parameters for devices of various types. While such heat type flow rate sensors are known to be capable of measuring the flow rates of gases at relatively high accuracy as compared to flow rate sensors of other types, in recent years, enhancement of the accuracy for measuring gas flow rate has become desirable. For example, with a vehicle to which an internal combustion engine is mounted, the demands for low fuel consumption and for exhaust gas purification are high. In order to satisfy such demands, there is a requirement for measurement at high accuracy of the amount of intake air, which is a principal parameter of an internal combustion engine.

A flow rate sensor that measures the amount of intake air conducted into an internal combustion engine includes an auxiliary passage that takes in a portion of the intake air amount, and a flow rate detection unit that is disposed in this auxiliary passage. The state of the gas to be measured as it flows in the auxiliary passage is measured by performing transmission of heat between the flow rate detection unit and the gas to be measured, and an electrical signal that specifies the amount of intake air being conducted into the internal combustion engine is outputted (for example, refer to PTL1).

An inlet that takes in some of the gas to be measured from a main passage through which it is flowing to the internal combustion engine, and an outlet that discharges to the main passage the gas that has been conducted from the inlet via the auxiliary passage to the flow rate detection unit, are provided in the casing of the flow rate sensor (refer to PTL1).

CITATION LIST

Patent Literature

PTL1: Japanese Laid-Open Patent Publication 2011-252796

SUMMARY OF INVENTION

Technical Problem

Although this matter is not discussed in PTL1, normally, the casing in which the flow rate detection unit is contained is constructed by adhering together a housing and a cover with adhesive. Side walls are formed in the housing for defining the inlet, the outlet, and the auxiliary passage in cooperation with the cover. Electronic components of various types that control the flow rate detection unit and so on are provided in the interior of the casing, and accordingly a sealed structure is essential in order to prevent short circuiting and corrosion of the wiring and the like. For this, the housing and the cover are sealed together and fixed together by using a plurality of adhesives. While adhesives can be hardened in different ways, from the point of view of the reliability for use in an automobile or the like, thermosetting adhesives are principally employed. However, if a thermosetting adhesive is used, a certain time period is required for heating and hardening of the adhesive, so that the productivity is compromised. Moreover the cost becomes high, because a large amount of adhesive is used for sealing. Furthermore, a certain area has to be secured in order to control protrusion of adhesive and so on, so that the freedom of design is restricted, and also it is difficult to adjust the amount of adhesive for sealing the electronic components.

Solution to Problem

A flow rate sensor according to a first aspect of the present invention comprises: a housing made from a resin material and having a bottom base portion and a side wall, at least one surface side of the housing being open; a cover made from a resin material, covering the one surface side of the housing, welded to an upper surface of the side wall of the housing, and defining, with the bottom base portion and the side wall of the housing, an auxiliary passage within which a gas to be measured flows that is taken in from a main passage; and a flow rate detection unit disposed within the auxiliary passage; wherein: a protruding portion for height control is provided to one of the housing and the cover at least in a vicinity of the side wall around the flow rate detection unit so as to suppress sinking in of the cover during welding.

Advantageous Effects of Invention

Since, according to the present invention, the housing and the cover are joined together by welding, accordingly it is possible to eliminate the time period that would be required for hardening in the case of an adhesive, and moreover it is possible to save the cost of using an adhesive. Furthermore, consideration of the area into which the adhesive protrudes and adjustment of the amount of adhesive become unnecessary, so that it is possible to anticipate increase of the efficiency of joining the parts together and a reduction in cost. Yet further, since the protruding portion for height control is provided in the neighborhood of the side wall in order to suppress sinking in of the housing or of the cover during welding, accordingly it is possible to reduce irregular variations in detection of flow rate.

BRIEF DESCRIPTION OF DRAWINGS

FIG. 2 shows figures showing the external appearance of the flow rate sensor: FIG. 2A is a left side view, and FIG. 2B is an elevation view;

FIG. 3 shows figures showing the external appearance of the flow rate sensor: FIG. 3A is a right side view, and FIG. 3B is a rear view;

FIG. 4 shows figures showing a housing of the flow rate sensor with a cover removed: FIG. 4A is a left side view of the housing, and FIG. 4B is an elevation view of the housing;

FIG. 5 shows figures showing the housing of the flow rate sensor with the cover removed: FIG. 5A is a right side view of the housing, and FIG. 5B is a rear view of the housing;

FIG. 7 shows figures showing the external appearance of a front cover.

FIG. 8 shows figures showing the external appearance of a rear cover: FIG. 8A is a left side view, FIG. 8B is an elevation view, and FIG. 8C is a plan view;

FIG. 9 is a figure showing a portion of a cross section along lines IX-IX in FIG. 4B;

FIG. 1AA is a sectional view before laser welding.

FIG. 17 shows figures related to laser welding of the housing and the front cover according to a seventh embodiment of the present invention: FIG. 17A is a sectional view before welding, while

FIG. 18 shows figures related to laser welding of the housing and the front cover according to an eighth embodiment of the present invention: FIG. 18A is a sectional view before welding, while FIG. 18B is a sectional view after welding;

FIG. 22 is a sectional view of the housing and the front cover after laser welding according to a twelfth embodiment of the present invention.

DESCRIPTION OF EMBODIMENTS

The embodiments for implementation of the present invention explained below solve various problems that need to be resolved for use as a manufactured product, and in particular solve various problems that need to be resolved for use as a measurement device that measures the amount of intake air of a vehicle, and moreover provide various beneficial effects. In the following embodiments, the same reference symbols are appended to the same elements and structures even in different figures, and the same advantageous operational effects are obtained. Moreover, to elements and structures that have already been explained, the same reference symbols are appended, and in some cases explanation thereof will be omitted.

Embodiment #1

An embodiment in which a flow rate sensor according to the present invention is used in an internal combustion engine control system.

Figure 1:
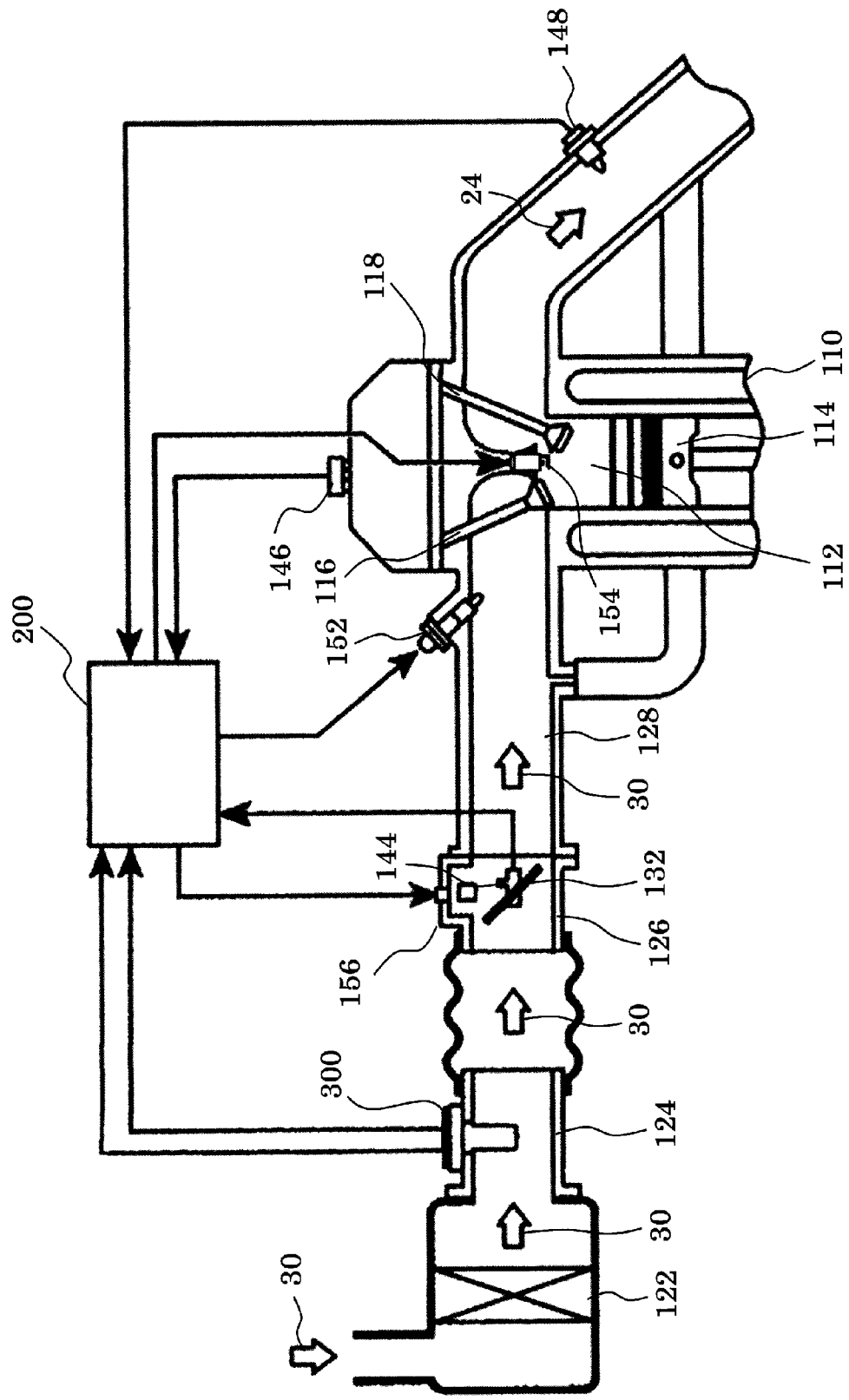
FIG. 1 is a structural system diagram showing an embodiment when a flow rate sensor according to the present invention is used in an internal combustion engine control system.

FIG. 1 is a system diagram illustrating an embodiment in which a flow rate sensor according to the present invention is used in an internal combustion engine control system that implements an electronic fuel injection method. On the basis of the operation of an internal combustion engine 110 that is provided with an engine cylinder 112 and with an engine piston 114, intake air, which is a gas 30 to be measured, is taken in from an air cleaner 122, and is conducted into a combustion chamber of the engine cylinder 122 via an intake body which is, for example, a main passage 124, and via a throttle body 126 and an intake manifold 128. The flow rate of the gas 30 to be measured, which is the intake air that is being conducted into the combustion chamber, is measured by a flow rate sensor 300 according to the present invention. Fuel is supplied by a fuel injection valve 152 on the basis of the flow rate that is measured, and is conducted into the combustion chamber in a mixture gas state together with the gas 30 to be measured, which is intake air. Typically, the flow rate sensor 300 is a heat type flow rate sensor that measures the state of gas to be measured that is flowing in an auxiliary passage by performing transmission of heat between the sensor and the gas to be measured.

It should be understood that, in this embodiment, the fuel injection valve 152 is provided in the intake port of the internal combustion engine, and fuel that is injected into the intake port forms mixture gas together with the gas 30 to be measured, which is intake air. This mixture gas is then conducted into the combustion chamber via an intake valve 116, and is combusted therein so as to generate mechanical energy.

In recent years, with many vehicles, as an excellent method for enhancing exhaust purification and fuel consumption, the method is being employed of attaching fuel injection valves 152 to the cylinder head of the internal combustion engine and directly injecting fuel from the fuel injection valves 152 into the combustion chambers. The flow rate sensor 300 of the present invention can be used, not only with the method of injecting fuel into the intake port of the internal combustion engine as shown in FIG. 1, but also, in a similar manner, with the method of directly injecting fuel into the combustion chambers. In both of these methods the basic concepts are approximately the same of the method of measuring the control parameters including the method of using a flow rate sensor 300, and of the control method for an internal combustion engine including the fuel supply amount and the ignition timing, and accordingly the method of injecting fuel into the intake port is shown in FIG. 1 as an example that is representative of both these methods.

The fuel and the air that have been introduced into the combustion chamber are in a state of mixed fuel and air and are explosively combusted due to spark ignition by a spark plug 154, and as a result mechanical energy is generated. The gas after combustion is conducted through an exhaust valve 118 into an exhaust conduit, and is discharged from the exhaust conduit to the exterior of the vehicle as exhaust 24. The flow rate of the gas 30 to be measured that is conducted into the combustion chamber, which is intake air, is controlled by a throttle valve 132 whose opening amount changes on the basis of operation of an accelerator pedal. And the fuel supply amount is controlled on the basis of this flow rate of intake air introduced into the combustion chamber. The driver can control the mechanical energy generated by the internal combustion engine by controlling the flow rate of intake air introduced into the combustion chamber by adjusting the opening amount of the throttle valve 132.

The flow rate and the temperature of the gas 30 to be measured, which is intake air, taken in from the air cleaner 122 and flowing in the main passage 124 are measured by the flow rate sensor 300. And an electrical signal is inputted to a control device 200 from the flow rate sensor 300, specifying the flow rate and the temperature of the intake air. Moreover, the output of a throttle angle sensor 144 that measures the opening amount of the throttle valve 132 is inputted to the control device 200. Furthermore the output of a rotational angle sensor 146 is inputted to the control device 200, in order to measure the position and the state of the engine piston 114, of the intake valve 116, and of the exhaust valve 118 of the internal combustion engine and also the rotational speed of the internal combustion engine. And, in order to measure the state of the ratio of mixing between the fuel amount and the air amount from the state of the exhaust 24, the output of an oxygen sensor 148 is inputted to the control device 200.

The control device 200 calculates a fuel injection amount and an ignition timing on the basis of the flow rate of intake air, this being the output of the flow rate sensor 300, and the rotational speed of the internal combustion engine that is measured on the basis of the output of the rotational angle sensor 146. The fuel amount supplied from the fuel injection valve 152 and the ignition timing at which ignition is provided by the spark plug 154 are controlled on the basis of the results of this calculation. Actually, the fuel supply amount and the ignition timing are further controlled in a fine-grained manner on the basis of the states of change of the intake temperature and of the throttle angle as measured by the flow rate sensor 300, on the basis of the state of change of the engine rotational speed, and on the basis of the state of the air/fuel ratio as measured by the oxygen sensor 148. In the idling operational state of the internal combustion engine, the control device 200 further controls an air amount that bypasses the throttle valve 132 with an idling air control valve 156, thereby controlling the rotational speed of the internal combustion engine in its idling operational state.

The Overall Structure of the Flow Rate Sensor 300

FIGS. 2 and 3 are figures showing the external appearance of the flow rate sensor 300: FIG. 2(A) is a left side view of the flow rate sensor 300, FIG. 2(B) is an elevation view thereof; FIG. 3(A) is a right side view thereof, and FIG. 3(B) is a rear view thereof.

The flow rate sensor 300 is provided with a casing 301 that includes a housing 302, a front cover 303, and a rear cover 304. The housing 302 and the front cover 303, and the housing 302 and the rear cover 304, are welded together with laser light. Structures and methods related to this laser welding will be described hereinafter. The housing 302 comprises a flange 312 for fixing this flow rate sensor 300 to an intake member which is the main passage 124, an external connection portion 305 having external terminals for establishing electrical connection with external equipment, a measurement unit 310 for measuring flow rate, and so on.

Auxiliary passage recesses are provided in the interior of the measurement unit 310 for defining an auxiliary passage. Moreover, a circuit package 400 (refer to FIG. 4(B) etc.) is provided in the interior of the measurement unit 310, and comprises a flow rate detection unit 436 (refer to FIG. 4(B) etc.) for measuring the flow rate of the gas 30 to be measured flowing in the main passage 124 and a temperature detection unit 452 (refer to FIG. 4(B) etc.) for measuring the temperature of the gas 30 to be measured flowing in the main passage 124.

The measurement unit 310 of the flow rate sensor 300 has a shape that extends lengthwise from the flange 312 towards the center of the main passage 124. At an end portion of the measurement unit 310, there are provided an inlet 350 for taking in a portion of the gas 30 to be measured such as intake air or the like into the auxiliary passage, and an outlet 352 for returning this gas 30 to be measured from the auxiliary passage to the main passage 124. While the measurement unit 310 has a shape that extends lengthwise along an axis from the outer wall of the main passage 124 toward its center, its width is formed to be narrow, as shown in FIG. 2(A) and FIG. 3(A). In other words, while the width of the side surface of the measurement unit 310 of the flow rate sensor 300 is thin, its front surface is formed in an approximately rectangular shape. Due to this, it is possible to provide the flow rate sensor 300 with an auxiliary passage of sufficient length, and it is possible to keep its fluid resistance with respect to the gas 30 to be measured down to a low value.

Since the inlet 350 of the flow rate sensor 300 is provided at the end of the measurement unit 310 that extends from the flange 312 toward the center of the main passage 124, accordingly it is possible to take into the auxiliary passage gas that is flowing, not in the neighborhood of the inner wall surface of the main passage 124, but in portions thereof that are far from its inner wall surface and close to its central portion. Due to this, the flow rate sensor 300 is able to measure the flow rate and the temperature of portions of the gas that are remote from the inner wall surface of the main passage 124, so that it is possible to prevent decrease of the accuracy of measurement due to the influence of heat or the like. The influence of the temperature of the main passage 124 can easily be experienced in the neighborhood of the inner wall surface of the main passage 124, and a state occurs in which the temperature of the gas 30 to be measured is different from the proper temperature of the gas, and comes to be different from the average state of the main body of gas in the main passage 124. In particular, if the main passage 124 is an intake body of the engine, then it is often the case that this passage experiences the influence of heat from the engine and is maintained at a high temperature. Due to this, it is often the case that the temperature of the gas in the neighborhood of the inner wall surface of the main passage 124 is higher than the temperature of the main flow of gas that is flowing in the main passage 124, and this can become a cause of reduction of the accuracy of measurement.

The fluid resistance in the neighborhood of the inner wall surface of the main passage 124 is high, so the flow speed there becomes slow as compared to the average flow speed in the main passage 124. Due to this, if gas in the neighborhood of the inner wall surface of the main passage 124 is taken into the auxiliary passage as the gas 30 to be measured, then reduction of the measurement flow speed with respect to the average flow speed in the main passage 124 may lead to measurement errors. However since, with the flow rate sensor 300 shown in FIGS. 2 and 3, the inlet 350 is provided at the end portion of the long and thin measurement unit 310 which extends from the flange 312 toward the center of the main passage 124, accordingly it is possible to reduce measurement errors associated with the reduction of the flow speed in the neighborhood of the inner wall surface of the main passage 124. Moreover since, with the flow rate sensor 300 shown in FIGS. 2 and 3, not only is the inlet 350 provided at the end portion of the measurement unit 310 which extends from the flange 312 toward the center of the main passage 124, but also the outlet 352 of the auxiliary passage is provided at the end portion of the measurement unit 310, accordingly it is possible further to reduce the measurement errors.

The Structure of the Housing 302

The state of the housing 302 of this heat type flow rate sensor 300 when the front cover 303 and the rear cover 304 have been removed therefrom is shown in FIGS. 4 and 5. FIG. 4(A) is a left side view of the housing 302, FIG. 4(B) is an elevation view of the housing 302, FIG. 5(A) is a right side view of the housing 302, and FIG. 5(B) is a rear view of the housing 302.

The housing 302 is constructed so that the measurement unit 310 extends from the flange 312 towards the center of the main passage 124, and is provided with auxiliary passage recesses 306 and 307 at its ends for defining the auxiliary passage. An inlet recess 351 for defining the inlet 350 of the auxiliary passage is formed at the end of the auxiliary passage recess 306, and an outlet recess 353 for defining the outlet 352 of the auxiliary passage is formed at the end of the auxiliary passage recess 307. Since the inlet recess 351 is provided in the end portion of the housing 302, accordingly it is possible for gas in the portion of the main passage 124 that is remote from its inner wall surface, or, to put it in another manner, gas that is flowing in a portion of the main passage 124 that is close to its central portion, to be taken in from the inlet 350 as the gas 30 to be measured.

A bottom base portion 311 is formed on the measurement unit 310 at the intermediate portion of the housing 302 in its thickness direction, and a front side auxiliary passage external side wall 391, a front side auxiliary passage internal side wall 392, and a front side upper side wall 393 are formed on the front surface of this bottom base portion 311 (refer to FIG. 4(B)). The outlet recess 353 for the gas 30 to be measured and the auxiliary passage recess 306 that discharges the gas 30 to be measured to the main passage 124 are defined by the front side auxiliary passage external side wall 391, the front side auxiliary passage internal side wall 392, and the front cover 303. Moreover, a rear side auxiliary passage external side wall 394, a rear side auxiliary passage internal side wall 395, and a rear side upper side wall 396 are formed on the rear surface of the bottom base portion 311 (refer to FIG. 5(B)). The inlet recess 351 that takes in the gas 30 to be measured from the main passage 124 and the auxiliary passage recess 307 that guides the gas 30 to be measured from the inlet recess 351 to the flow rate detection unit 436 are defined by the rear side auxiliary passage external side wall 394, the rear side auxiliary passage internal side wall 395, and the rear cover 304. The front side auxiliary passage external side wall 391 and the rear side auxiliary passage external side wall 394 have curved portions that are formed in helical shapes, so as to guide the gas 30 to be measured.

A flow rate detection element 602 (refer to FIG. 9) is included in the flow rate detection unit 436, and the flow rate detection unit 436 and the temperature detection unit 452 are integrated together with the housing 302 by insert molding as the circuit package 400. This circuit package 400 is initially mold-formed in advance with resin, before being integrated into the housing 302. The structure of this circuit package 400 that is thus initially mold-formed will now be explained.

The Structure of the Circuit Package 400

FIG. 9 is a figure showing a portion of a cross section along lines IX-IX in FIG. 4(B).

A flow rate detection element 602, which includes a semiconductor element, is an element that measures the flow rate of the gas 30 to be measured by performing transmission of heat between the element and the gas 30 to be measured that is taken in from the main passage 124 and that is flowing in the auxiliary passage.

In this flow rate detection element 602 that measures the flow rate of the gas 30 to be measured, a space 674 is formed on its rear surface, so that a diaphragm is defined in a flow rate detection region (i.e. a heat transmission surface) 437 of the flow rate detection element. At the front surface of this diaphragm 672, an element is disposed that performs exchange of heat with the gas 30 to be measured so as to measure the flow rate.

Here if, apart from exchange of heat with the gas 30 to be measured, also heat is transmitted between elements via the diaphragm 672, then it becomes difficult to measure the flow rate accurately. Due to this it is necessary to make the thermal resistance of the diaphragm 672 high, and accordingly the diaphragm 672 is made to be as thin as possible.

Furthermore, in the circuit package 400, a first plate 532 for defining a communicating passage is arranged upon a second plate 536 that corresponds to a lead. The flow rate detection element 602 in the form of a chip and a processing unit 604 are built as LSI mounted upon the first plate 532. Terminals of the flow rate detection element 602 and the processing unit 604 are electrically connected together by wires 542 via aluminum pads. Moreover, the processing unit 604 is connected to the second plate 536 by wires 543 via aluminum pads. Yet further, a plurality of connection terminals 412 for electrical connection with the terminal connection portion 320 (refer to FIG. 4(B)) are provided upon the second plate 536. The connection terminals 412 are electrically connected to the flow rate detection element 602 via the processing unit 604 with a structure as explained.

The flow rate detection element 602 is embedded and fixed in a first resin mass of the circuit package 400 that has been formed by a first resin molding process, so that the heat transmission surface 437 of the diaphragm 672 is exposed. An element not shown in the figures, such as a resistor or the like, is provided to the front surface of the diaphragm 672. This element performs mutual transmission of heat with the gas 30 to be measured via the heat transmission surface 437 of the element front surface.

A region of the flow rate detection element 602 around the diaphragm 672 (in other words, a region of the flow rate detection element 602 surrounding a portion where the element described above is provided), its entire circumference of side surfaces, and its rear surface are covered by the thermosetting resin that is used in the first resin molding process, so as to define a vent passage 676 that vents the space 674 to the exterior.

In order to suppress mutual transmission of heat with various elements, the diaphragm 672 is made to be extremely thin by forming the space 674 on the rear surface of the flow rate detection element 602. If this space 674 that is defined at the rear surface of the diaphragm 672 were to be sealed, then, due to temperature changes, the pressure in this space 674 would change according to the temperature. If the pressure difference between the space 674 and the front surface of the diaphragm 672 were to become great, then the diaphragm 672 would experience pressure and would undergo distortion, so that measurement at high accuracy would become difficult. Because of this, the plate 532 is provided with a hole 520 that connects to an aperture 438 that opens to the exterior, a hole 521 that communicates with the space 674, and a vent passage 676 that connects the space 674 to the exterior via the holes 520 and 521.

LSI provided upon the plate 532 operates as the flow rate detection element 602 and the processing unit 604. Under these, a lead frame 536 is provided for supporting the plate 532 upon which the flow rate detection element 602 and the processing unit 604 are mounted. Accordingly, by employing this lead frame 536, the construction becomes more simple.

The surroundings of the circuit package 400 in the housing 302 constitute a cavity portion 382. As shown in FIG. 4(B), the circuit package 400 is fixed by a fixing portion 376 of the housing 302 that is formed at the front and rear surfaces of the circuit package 400. The fixing portion 376 is formed to be lower than the heights of the side walls 391 through 396. The portion of the circuit package 400 other than the portion that is covered over by the fixing portion 376 is exposed to the cavity portion 382. And the area of the circuit package 400 that is exposed to the cavity portion 382 is larger than the area of the fixing portion 376. Due to this, the circuit package 400 is not readily affected by heat of the housing 302 transmitted via the fixing portion 376.

A slit 372 that is lower than the height of the side walls 391 through 396 is formed in the neighborhood of the flow rate detection unit 436 of the housing 302, at one side of the fixing portion 376. This slit 372 connects the aperture 438 formed on the circuit package 400 (refer to FIG. 9) with the flow rate detection unit 436 so as to communicate the gas 30 to be measured.

The Structure for External Connection

During secondary molding in which the circuit package 400 is insert-molded into the housing 302, the terminal connection portion 320 is formed integrally with the housing 302. After secondary molding, the connection terminals 412 of the circuit package 400 and external terminal inner ends 361 of the external connection portion 305 are wired together by welding or solder fixing or the like.

In this first embodiment, the auxiliary passage recesses 306, 307 are provided for defining the auxiliary passage in the housing 302. The auxiliary passage is formed by positioning the front and rear covers 303, 304 upon the front surface and upon the rear surface of the housing 302 respectively, and by welding, with a laser, the front cover 303 and the rear cover 304 to the upper surfaces of the side walls 391 through 396 that are disposed in the neighborhood of the auxiliary passage recesses 306, 307 respectively. Moreover, by the front cover 303 and the rear cover 304 being provided on both sides of the housing 302, it is possible to form the auxiliary passage on both sides of the housing 302.

The side walls 391 through 396 of the housing 302 are welded to the front and rear covers 303, 304 with laser light, but the slit 372 is not welded, and remains in a state with a clearance of around 0.1 mm being left between it and the rear surface of the front cover 303.

It should be understood that, while protruding portions 450 for height control (height controlling protrusions) are shown in FIG. 4(B) as being formed at two spots, i.e. at the central portion of the slit 372 and between the lower end portion of the circuit package 400 and the upper end portion of the front side auxiliary passage internal side wall 392, alternatively, as will be described hereinafter, the protruding portions 450 for height control could also be formed upon the front and rear covers 303, 304. These protruding portions for height control 450 will be described hereinafter.

Figure 6:
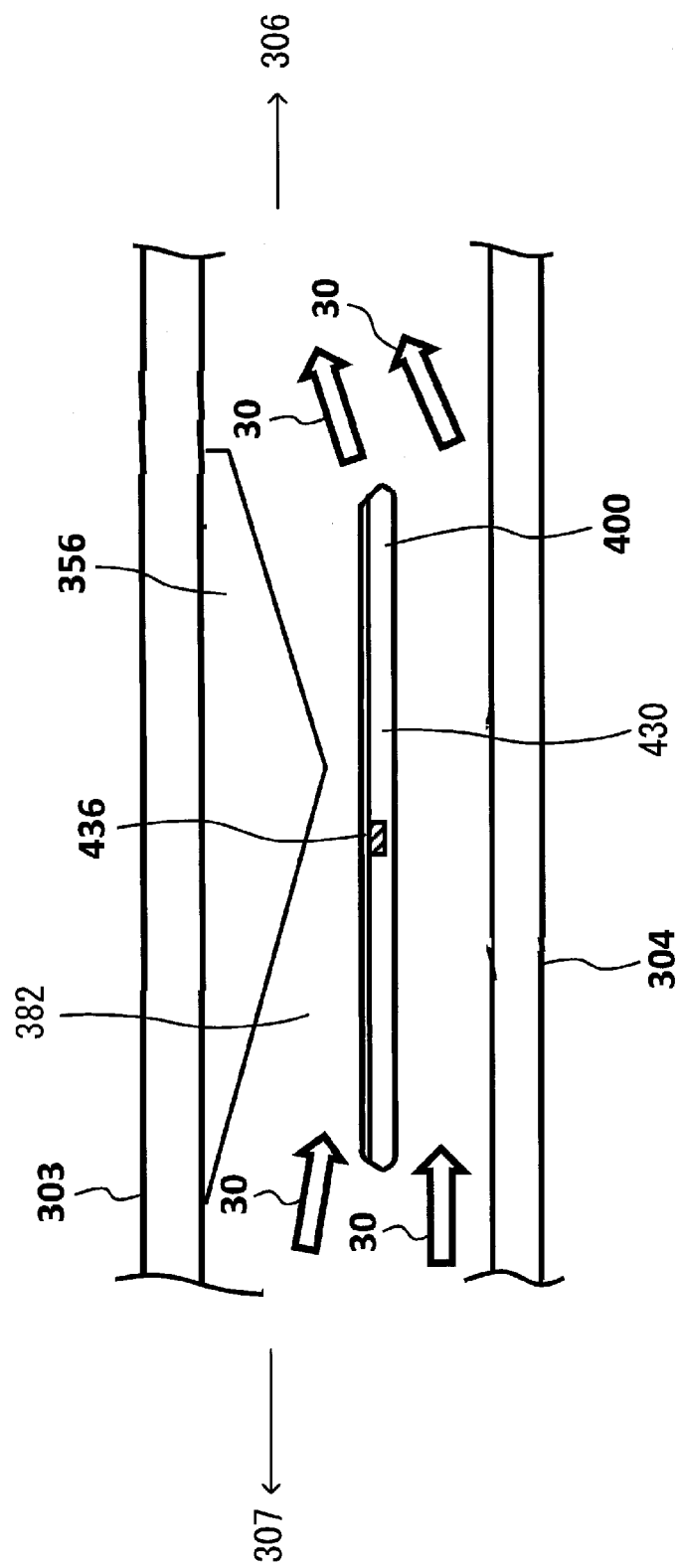
FIG. 6 is an enlarged sectional view taken along lines VI-VI in FIG. 4B.

FIG. 6 is an enlarged sectional view taken along lines VI-VI in FIG. 4(B), and is a partial enlarged view showing a state in which a flow conduit surface for measurement 430 of the circuit package 400 is disposed in the interior of the auxiliary passage recess.

The left side portion in FIG. 6 is the final end portion of the auxiliary passage recess 307 on the rear side, and the right side portion is the starting end portion of the auxiliary passage recess 306 on the front side.

As described above, the surroundings of the circuit package 400 constitute the cavity portion 382. The gas 30 to be measured that is taken in from the inlet 350 and flows in the rear side auxiliary passage recess 307 is conducted from the left side of FIG. 6. A portion of this gas 30 to be measured flows via the upstream side of the cavity portion 382 of the circuit package 400 through an upper side flow conduit portion between the front surface of the flow conduit surface for measurement 430 of the circuit package 400 and a throttling portion 356 that is provided upon the front cover 303. Moreover, the remainder of the gas 30 to be measured flows through a lower side flow conduit portion between the opposite side of the circuit package 400 to the flow conduit surface for measurement 430 and the rear cover 304. A portion of air included in the gas 30 to be measured whose mass is small flows through the upper side flow conduit portion between the front surface of the flow conduit surface for measurement 430 and the throttling portion 356 upon the front cover 303. And, since a foreign matter whose mass is large cannot easily change the direction of its path abruptly due to inertia, accordingly this foreign matter flows through the lower side flow conduit portion between the surface on the opposite side to the flow conduit surface for measurement 430 and the rear cover 304.

The gas 30 to be measured that flows through the upper and lower side flow conduit portions passes toward the front side auxiliary passage recess 306 via the downstream side of the cavity portion 382 of the circuit package 400 and flows through the front side auxiliary passage recess 306, and is then discharged from the outlet 352 into the main passage 124. And the gas 30 to be measured that passes via the slit 372 between the aperture 438 of the circuit package 400 and the flow rate detection unit 436 also joins to the above flow at the downstream side of the cavity portion 382, flows through the front side auxiliary passage recess 306, and then is discharged from the outlet 352 into the main passage 124.

The Structure of the Front Cover 303 and the Rear Cover 304

Figure 7C:
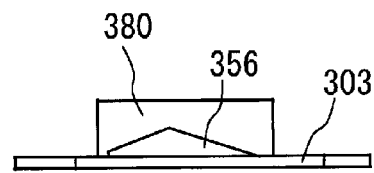
FIG. 7C is a plan view.
Figure 7A:
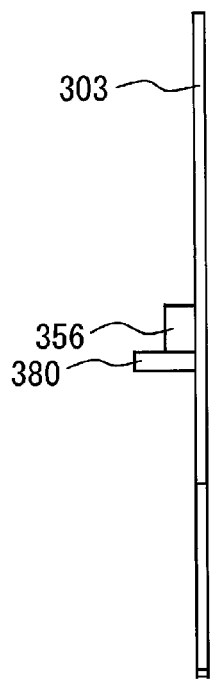
FIG. 7A is a left side view.
Figure 7B:
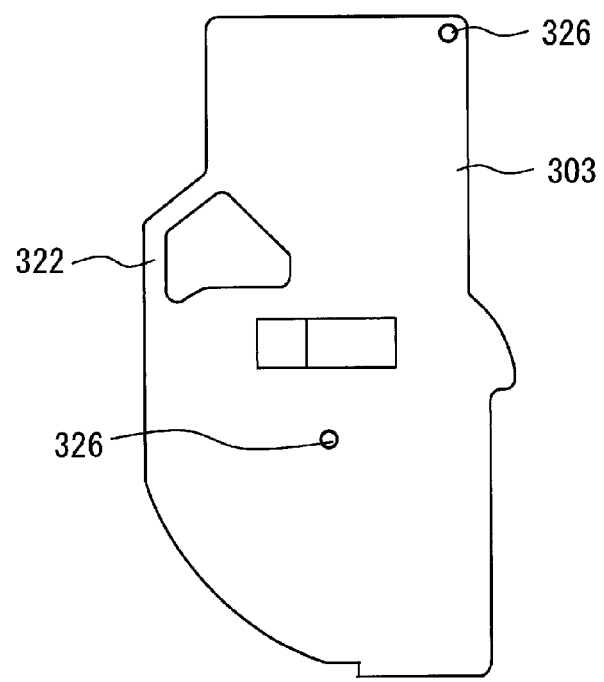
FIG. 7B is an elevation view.

FIG. 7 shows figures showing the external appearance of the front cover: FIG. 7(A) is a left side view, FIG. 7(B) is an elevation view, and FIG. 7(C) is a plan view. Furthermore, FIG. 8 shows figures showing the external appearance of the rear cover: FIG. 8(A) is a left side view, FIG. 8(B) is an elevation view, and FIG. 8(C) is a plan view.

In FIG. 2 and FIG. 3, the front cover 303 and the rear cover 304 define the auxiliary passage by closing the auxiliary passage recesses 306, 307 of the housing 302. Moreover, the throttling portion 356 is provided on the front cover 303 at a position that faces the circuit package 400 in a portion between the front side auxiliary passage external side wall 391 and the front side auxiliary passage internal side wall 392. This throttling portion 356 has the function of throttling down the upper side flow conduit portion, and has a triangular shape formed with a sloping surface toward the upstream side of the flow conduit that is more gently inclined than a sloping surface toward the downstream side of the flow conduit. Due to this shape, the throttling portion 356 reduces eddies generated in the gas 30 to be measured, and accordingly operates to generate laminar flow.

Furthermore, a projecting portion 380 is formed on the inner side of the front cover 303 adjacent to the throttling portion 356, and a projecting portion 381 is formed on the rear cover 304, so that, when the covers are welded to the housing 302, these are fitted in a space of the cavity portion 382 at the end of the circuit package 400 and simultaneously cover the end portion of the circuit package 400.

Protective portions 322 are formed on the front cover 303 and the rear cover 304. As shown in FIG. 2 and FIG. 3, the front side protective portion 322 provided to the front cover 303 is arranged at the front side of the inlet 343 where the gas 30 to be measured enters to the temperature detection unit 452, and the rear side protective portion 322 provided to the rear cover 304 is arranged at the rear side of the inlet 343. During production and transport, these protective portions 322 prevent the temperature detection unit 452 from experiencing mechanical damage due to contact or collision with other equipment, and the like.

Moreover, insertion holes 326 are formed in the front cover 303 and in the rear cover 304 for initial positional adjustment during laser welding. By setting projecting pins 324 shown in FIGS. 4(B) and 5(B) that are formed upon the housing 302 into these insertion holes 326 for reference, it becomes possible to perform initial positional adjustment.

Welding Together of the Covers and the Housing

One of the main distinguishing features of the flow rate sensor 300 of the present invention is that the casing 301 is built by welding together the housing 302 and the front cover 303, and the housing 302 and the rear cover 304, with laser light.

In the following, the method will be explained for welding together with laser light the housing 302 and the front cover 303, and the housing 302 and the rear cover 304.

The principal material used for the housing 302, the front cover 303, and the rear cover 304 may, for example, be a crystalline resin whose heat resistance is high, such as polybutylene terephthalate (PBT), polyphenylene sulfide (PPS), polyamide 6 (PA6), polyamide 66 (PA66), polyamide 6T (PA6T), or polyamide 9T (PA9T).

Laser welding is a method in which two resin materials are mutually joined together by, in the state in which a light transmissive resin material and a light absorbent resin material are stacked one on top of the other, irradiating the junction portion with laser light through the light transmissive resin material so that the light absorbent resin material is melted, and continuing this process until the light transmissive resin material is also melted. As the light source employed for such laser welding, a laser such as a semiconductor laser, a YAG laser, or a fiber laser, having a wavelength in the infra-red region from 800 nm to 1100 nm, is effective from the point of view of cost; but, depending upon the absorption of the resin, it would also be possible to employ a laser having a different wavelength.

Furthermore, while it is possible to use laser light sources having various types of intensity distribution by employing lenses of Gaussian, top hat, or ring type or the like, welding can be performed uniformly if a top hat or a ring type laser light source is employed. While irradiating with the laser light for welding, the laser light source or the materials being processed may be physically shifted with a stage, or, alternatively, it would also be possible to control the laser light itself by using a Galvano mirror.

First, a Summary of the Laser Welding Will Be Explained.

First, the housing 302 is set in a predetermined position, and position adjustment is performed by positioning the insertion holes 326 that are formed in the covers 303, 304 over the projecting pins 324 that are formed on the housing 302 for reference, so that the covers 303, 304 are positioned against the housing 302 with good accuracy. Then the covers 303, 304 are pressurized with a transparent pressing material such as glass or acrylic resin or the like, so that the covers 303, 304 are closely attached to the housing 302. It is desirable to set the applied pressure to be 0.1 MPa or greater. In this state, these members are welded together by irradiating with a laser upon them.

Since as described above the structure of the housing 302 of the flow rate sensor 300 is complicated and the amount by which it bends is comparatively great, as a result, gaps at some of the welding locations become large, even though the covers 303, 304 are pressurized. As a countermeasure against this, it has been discovered that it is possible to perform uniform laser welding by irradiating with the laser beam at various spots a plurality of times at different laser speeds or at different powers and causing the welding spots at the covers 303, 304 to sink in.

The length of laser welded portions 390 of the flow rate sensor 300 of the present invention (refer to FIG. 10) is large, being 20 cm or greater. Due to this, it might be considered that welded portions remote from the location where laser welding is being performed would not sink in, even in a case where the material employed is, for example, a thermoplastic resin whose thermal conductivity is comparatively low. However actually, if for example welding is performed over 20 cm during the period of 10 seconds, the entire front and rear covers 303, 304 sink in, including not only the portions on which the laser light is irradiated but also other portions. Moreover, the amount of sinking varies between different samples. Due to this, the new problem arises that the characteristics of the flow rate sensor exhibit unpredictable variation.

In this connection, as a result of investigations into the sensitivity to the sinking in of the front and rear covers 303, 304 that causes change in the characteristics, in particular, it has been understood that the distance between the flow rate detection unit 436 and the throttling portion 356 of the front cover 303 is the factor that exerts the greatest influence.

In the following, a configuration and a method for welding will be provided that can efficiently join together the front and rear covers 303, 304 and the housing 302, and that moreover can suppress irregular variation of the characteristics of the flow rate sensor 300.

Figure 10:
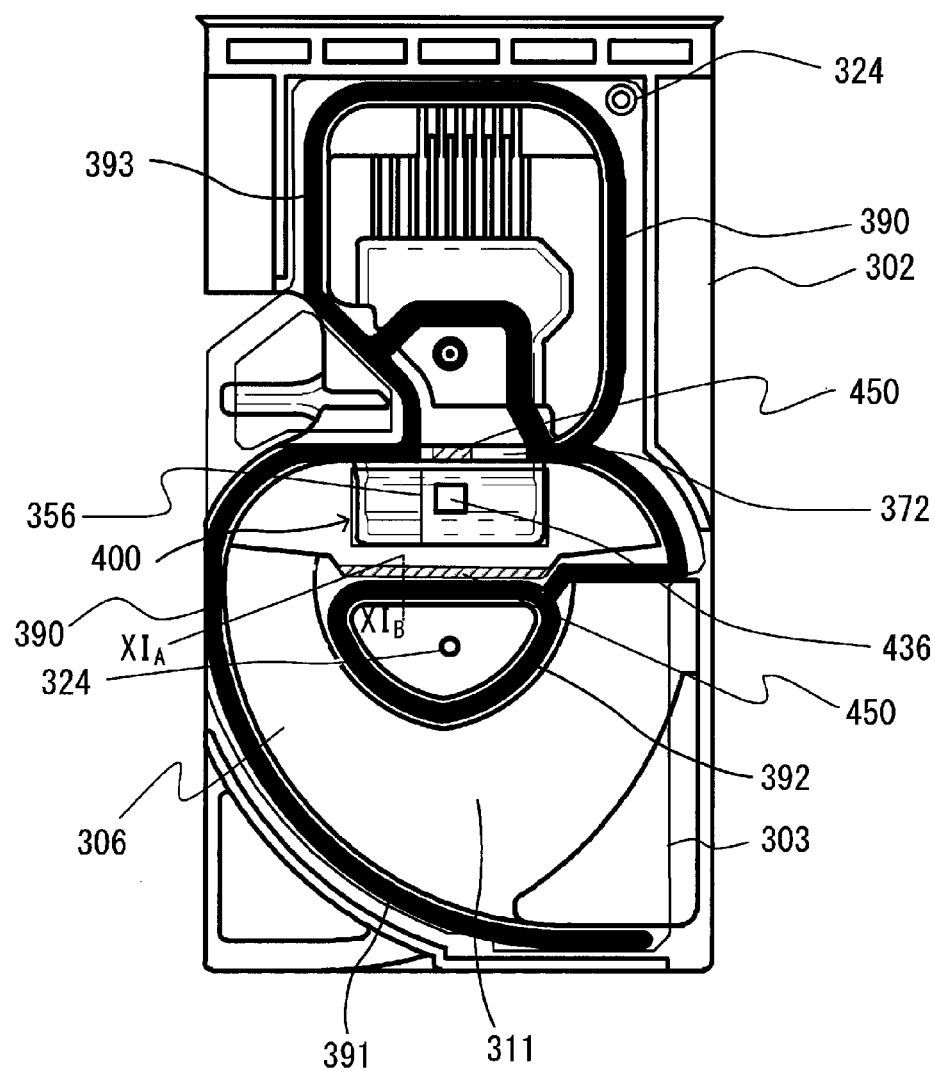
FIG. 10 is a plan view for explanation of the arrangement and structure of welded portions where the front cover and the housing are welded together, and of a protruding portion for height control.

FIG. 10 is an example of a plan view for explanation of the arrangement and the structure of the laser welded portions 390 where the front cover 303 and the housing 302 are welded together by welding with laser light (hereinafter termed "laser welding"), and for explanation of the protruding portions 450 for height control. While in the following the case of joining together the front cover 303 and the housing 302 with laser welding is explained, it should be understood that the same holds for the case of joining together the rear cover 304 and the housing 302 with laser welding.

The upper surfaces of the front side auxiliary passage external side wall 391, of the front side auxiliary passage internal side wall 392, and of the front side upper side wall 393 that are provided to the housing 302 are the portions 390 that are to be welded to the front cover 303.

The protruding portion or portions 450 for height control are provided on either the front cover 303 or the housing 302. In the example shown in FIG. 10, protruding portions 450 for height control are provided at two spots: at the central portion of the slit 372, and between the lower end portion of the circuit package 400 and the upper end portion of the front side auxiliary passage internal side wall 392. In order to prevent sinking in at the portion between the flow rate detection unit 436 and the throttling portion 356 of the front cover 303, and in order thus to ensure that the gap between the flow rate detection unit 436 and the throttling portion 356 is set to a fixed value, it is desirable to provide the protruding portion 450 for height control on the both sides of the flow rate detection unit 436 as explained above.

Figure 11A:
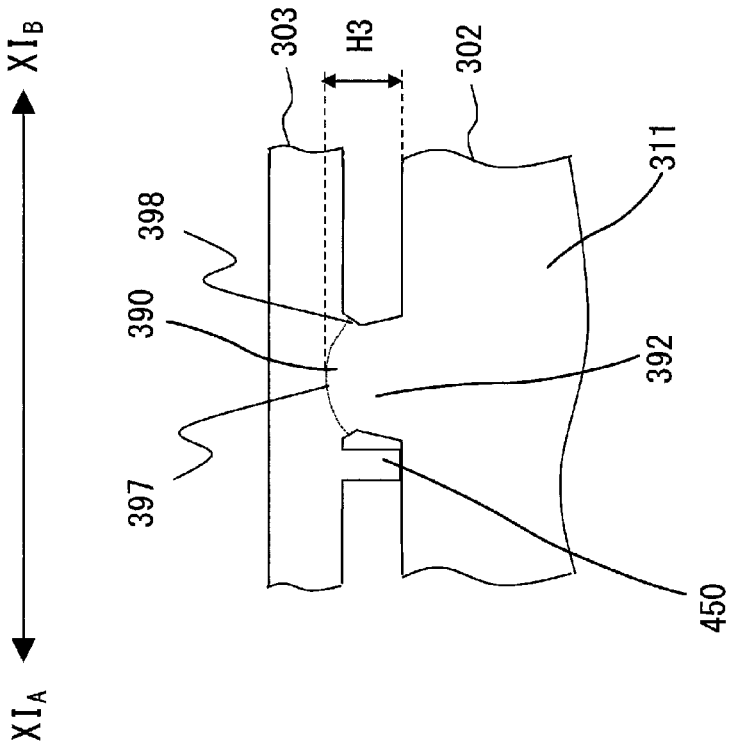
FIG. 11 shows sectional views of FIG. 10 along lines $XI_A$-$XI_B$.
FIG. 11B is a sectional view after laser welding.
Figure 11B:
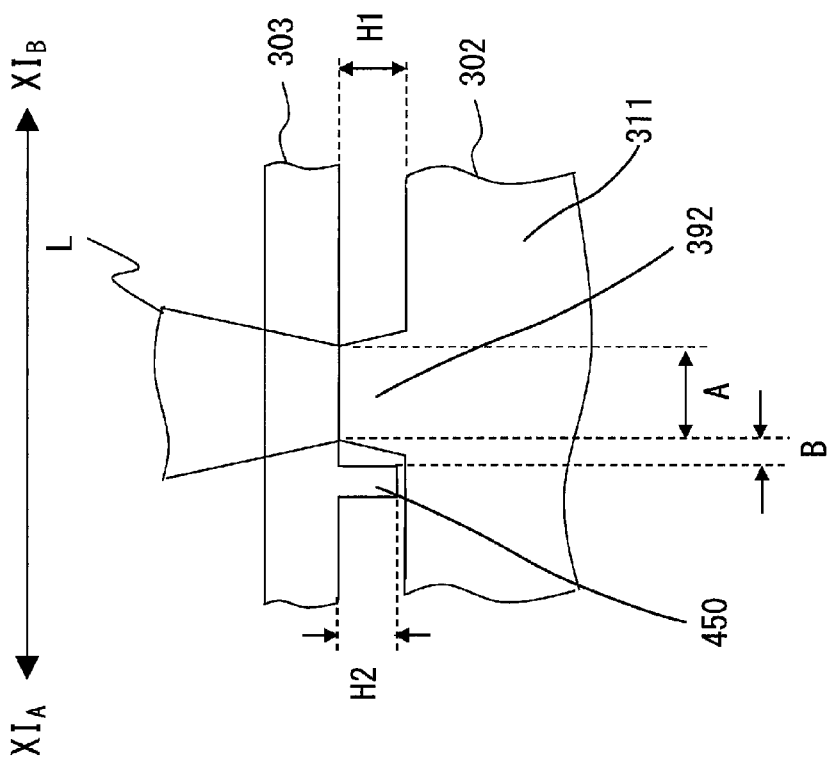

FIG. 11 shows sectional views of FIG. 10 along lines $XI_A$-$XI_B$: FIG. 11(A) is a sectional view before laser welding, and FIG. 11(B) is a sectional view after laser welding.

In FIG. 11(A), an example is shown of a structure in which the protruding portion 450 for height control is provided on the front cover 303.

Before the laser welding, the height H2 of the protruding portion 450 for height control that is provided upon the front cover 303 is less than the height H1 of the front side auxiliary passage internal side wall 392 of the housing 302. It is desirable for the difference (H1−H2) between the height H1 of the front side auxiliary passage internal side wall 392 and the height H2 of the protruding portion 450 for height control to be set, for example, to 50 μm to 100 μm.

It should be understood that, in the following explanation, the front side auxiliary passage internal side wall 392 is simply termed the "side wall 392", and the front cover 303 is simply termed the "cover 303".

In the state shown in FIG. 11(A), laser light L is shone upon the cover 303 that is pressurized against the upper surface of the side wall 392 that is provided upon the bottom base portion 311, and thereby the state shown in FIG. 11(B) results, in which the upper portion of the side wall 392 and the cover 303 are welded together.

By directing the laser light L a plurality of times toward the region of the cover 303 that contacts the upper surface of the side wall 392, the upper portion of the side wall 392 of the housing 302 is melted, and blends into the cover 303. And the lower surface of the protruding portion 450 for height control that is formed upon the cover 303 tightly attached to the upper portion of the bottom base portion 311 of the housing 302.

It should be understood that, even when the protruding portion 450 for height control is formed, the laser welded portions 390 do continue to sink in due to irradiation of the laser light being continued. Due to this, it is necessary to provide the protruding portion 450 for height control in the interior of the auxiliary passage, so as to make it possible to reduce irregular variation in the height of the flow conduit that is defined by the gap between the flow rate detection unit 436 and the throttling portion 356.

In FIG. 11(B), during laser irradiation, a state is shown where the lower surface of the protruding portion 450 for height control is closely contacted against the housing 302. However, due to roughnesses of the front surfaces of the cover 303 and/or the housing 302 and/or due to undulations of those front surfaces, even in the state in which the cover 303 is pressurized, only portions of the upper surface of the side wall 392 of the housing 302 and the inner surface of the cover 303 are in close mutual contact, while gaps appear at other spots. If these gaps are present, by irradiating the laser light L a plurality of times, resin burrs 398 appear in the resin from which the housing 302 and the cover 303 are made, with these burrs projecting in the widthwise direction of the laser welded portions.

At this time, in the central portion widthwise of the laser welded portion 390, as shown in FIG. 11(B), the resin of the side wall 392 of the housing 302 is in the state of having blended into the resin of the cover 303. The greatest height H3 of a penetration boundary surface 397 of the side wall 392 from the upper surface of the bottom base portion 311 is greater than the height H2 of the protruding portion 450 for height control.

In other words, when the laser light L is irradiated a plurality of times, the highest height H3 of the penetration boundary surface 397 of the side wall 392 which is the light absorbent resin at a welding position is larger than the height H2 of the protruding portion 450 for height control from the upper surface of the bottom base portion 31.

Accordingly, by the provision of the protruding portion 450 for height control, control of the height of the auxiliary passage to a predetermined value becomes possible, and change of the characteristics of the flow rate sensor 300 is thereby moderated. Along with this, the compatibility between the resin of the cover 303 and the resin of the housing 302 is enhanced, and the penetration of the resin of the housing 302 into the resin of the cover 303 is increased, so that the strength of the resulting weld is increased. Furthermore since, due to the resin of the housing 302 blending into the resin of the cover 303, the length of the path that suppresses development of cracking becomes longer, so that the strength is enhanced, and the reliability of the laser welded portion 390 is also enhanced.

It should be understood that, if the resin burr 398 appears at a position closely in contact with the side of the protruding portion 450 for height control, then this protruding portion becomes a stopper for development of the resin burr 398, so that it comes to exert a undesirable influence upon the height of the welded portion. Due to this, it is necessary for the protruding portion 450 for height control to be provided at a position in which no resin burr 398 can come into close contact therewith. The result of investigations into the configuration of the first embodiment described above has been that, if the width of the side wall 392 of the housing 302 is termed A, the height to which the resin burr 398 projects is 0.3 A to 0.35 A with approximately 80 μm of sinking in. Accordingly, in order to achieve the amount of sinking in of 50 μm to 100 μm, the distance B between the side wall 392 of the housing 302 and the protruding portion 450 for height control may be set to 0.4 A or greater.

Advantageous Effects of the First Embodiment

According to this first embodiment of the present invention, the advantageous effects described below may be obtained.

(1) The side walls 391 through 396 for defining the auxiliary passage to the flow rate detection unit 436 are defined upon the front and rear surfaces of the housing 302, and the upper surfaces of the side walls 391 through 396 and the front and rear covers 303, 304 are welded together with laser welding. Due to this, the time period for hardening and the cost of adhesive if adhesive were to be used are eliminated, and moreover the needs for investigation of regions in which adhesive is protruding and for control of the amount of adhesive disappear, so that it is possible to anticipate increase in the efficiency of assembly and reduction in the cost.

(2) The protruding portions 450 for height control for preventing sinking in of the housing or the covers during welding are provided either to the housing 302 or to the front and rear covers 303, 304. And the height H2 of these protruding portions 450 for height control is smaller than the height H1 of the side wall 392 of the housing 302. And, when the laser light L is irradiated a plurality of times, the highest height H3 of the penetration boundary surface 397 of the side wall 392, which is the welding spot upon the light absorbent resin, from the upper surface of the bottom base portion 311 comes to be greater than the height H2 of the protruding portion 450 for height control. In this state, the lower surface of the protruding portion 450 for height control is closely contacted against the housing 302. Due to this, sinking in of the cover 303 is suppressed, and it becomes possible to reduce irregular variations in flow rate detection.

(3) In the flow rate sensor 300, the protruding portion 450 for height control is provided in the neighborhood of the flow rate detection unit 436, which is the part that most greatly influences change of the characteristics of the flow rate sensor 300. Due to this it is possible, via a simple construction, to anticipate that the detection performance will be ensured.

(4) The protruding portion 450 for height control is provided in a position which does not closely contact with the resin burrs 398 even if, during laser welding, the resin burrs 398 develop and are formed so as to project in the widthwise direction from the laser welded portions 390, in other words in a direction which intersects the side wall 3921. Due to this, the protruding portion 450 for height control does not become a stopper for development of any resin burrs 398, so that sinking in of the cover 303 is not affected.

Embodiment #2

Figure 12:
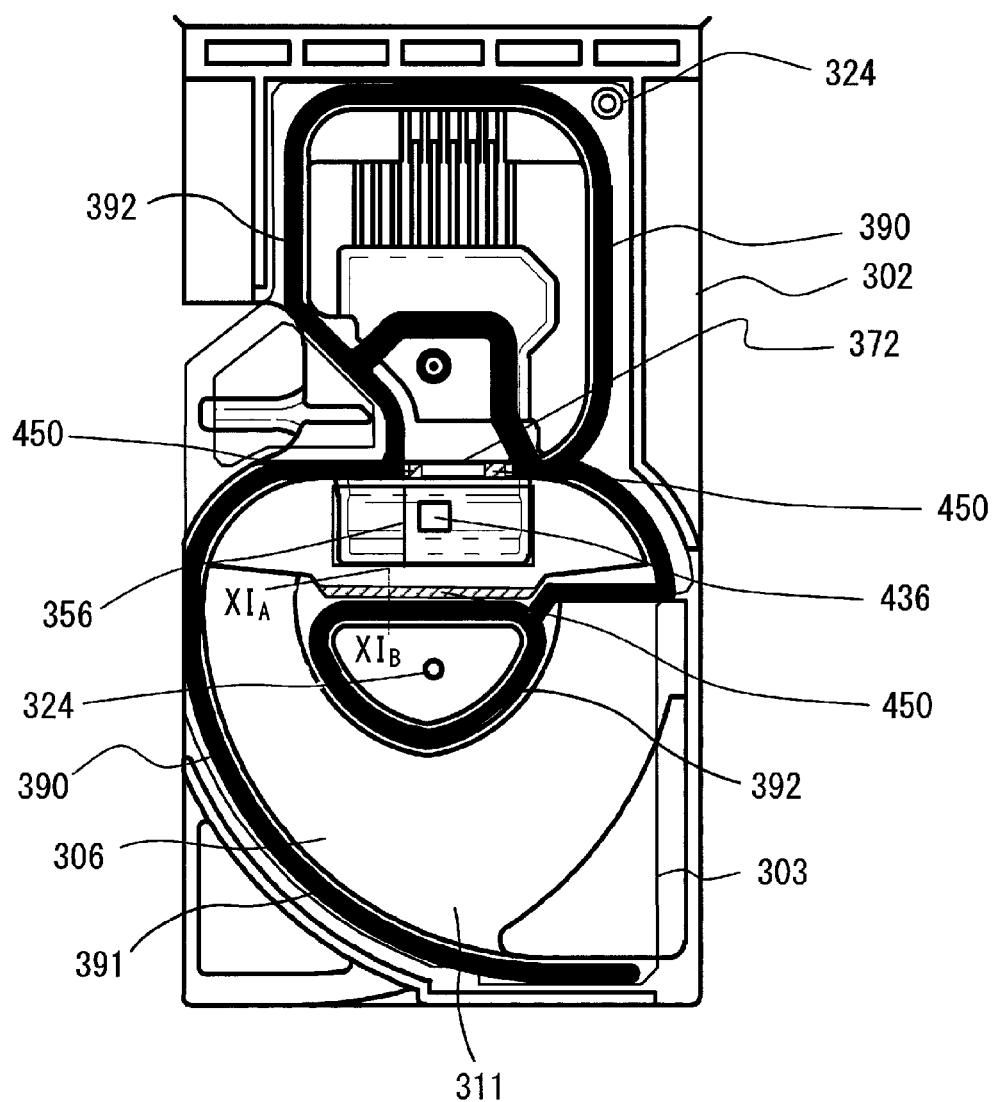
FIG. 12 is a plan view showing the arrangement and structure of the protruding portion for height control according to a second embodiment of the present invention.

FIG. 12 is a plan view showing the structure and arrangement of the protruding portions 450 for height control according to a second embodiment of the present invention.

In the flow rate sensor 300 of the second embodiment shown in FIG. 12, protruding portions 450 for height control are provided at three spots in the neighborhood of the flow rate detection unit 436. That is to say, protruding portions 450 for height control are provided at the following three spots: both sides of the slit 372; and between the lower end portion of the circuit package 400 and the upper end portion of the front side auxiliary passage internal side wall 392. By providing these protruding portions 450 for height control at these three spots that surround the flow rate detection unit 436, it is possible to enhance the stability of the size of the gap between the throttling portion 356 of the cover 303 and the flow rate detection unit 436 by yet a further level.

Similar advantageous effects are obtained in the case of this second embodiment as in the case of the first embodiment.

The other structures of this second embodiment are the same as in the case of the first embodiment, and accordingly the same reference symbols are appended to corresponding elements, and explanation thereof is omitted.

Embodiment #3

Figure 13:
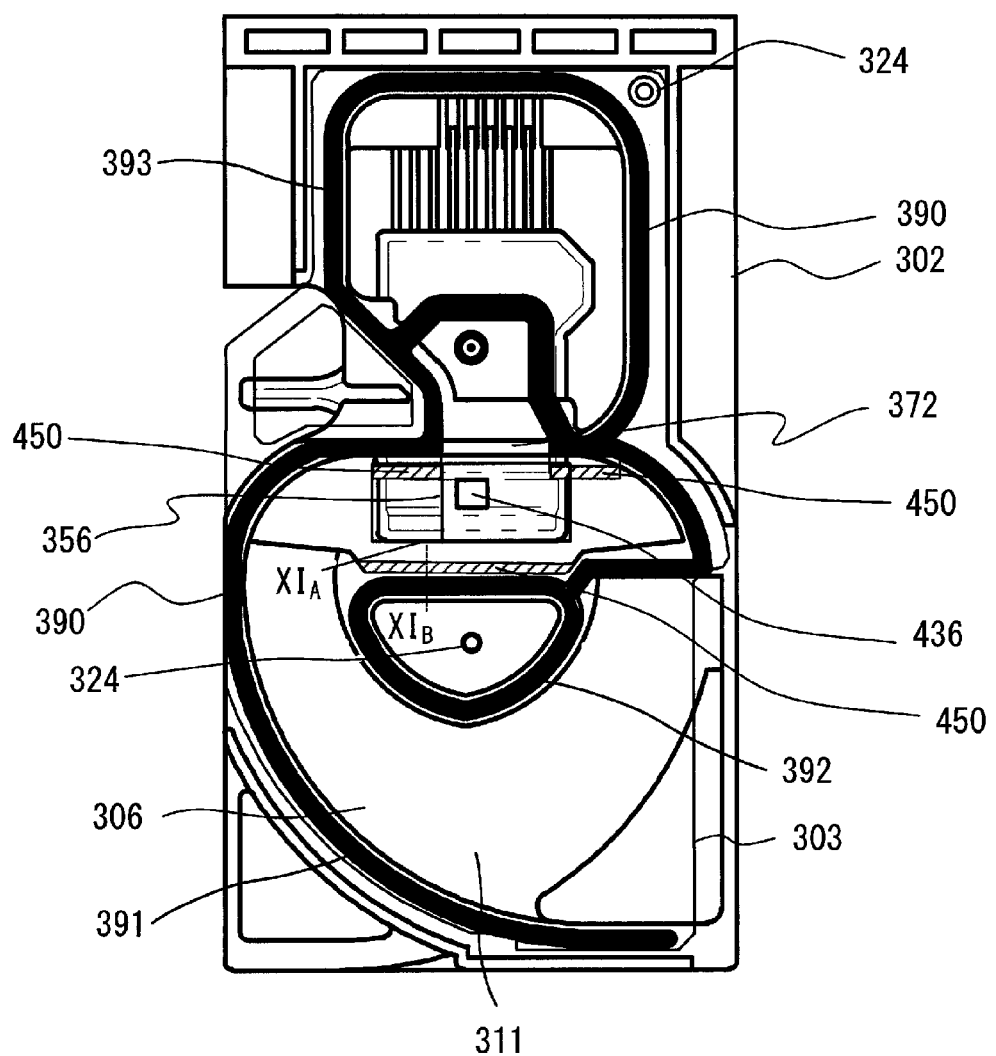
FIG. 13 is a plan view showing the arrangement and structure of the protruding portion for height control according to a third embodiment of the present invention.

FIG. 13 is a plan view showing the structure and arrangement of the protruding portions 450 for height control according to a third embodiment of the present invention.

In the flow rate sensor 300 of the third embodiment shown in FIG. 13, protruding portions 450 for height control are provided at three spots in the neighborhood of the flow rate detection unit 436. That is to say, protruding portions 450 for height control are provided at the following three spots: along the front side auxiliary passage external side wall 391 adjacent to both sides of the slit 372; and between the lower end portion of the circuit package 400 and the upper end portion of the front side auxiliary passage internal side wall 392.

In this third embodiment, since the distance over which the pair of protruding portions 450 for height control are formed on both sides of the slit 372 is greater than the distance over which the pair of protruding portions 450 for height control shown in the second embodiment are formed on both sides of the slit 372, accordingly it is possible to enhance the stability of the size of the gap between the throttling portion 356 of the cover 303 and the flow rate detection unit 436 even further.

The other structures of this third embodiment are the same as in the case of the first embodiment, and accordingly the same reference symbols are appended to corresponding elements, and explanation thereof is omitted.

Similar advantageous effects are obtained in the case of this third embodiment as in the case of the first embodiment.

Embodiment #4

Figure 14:
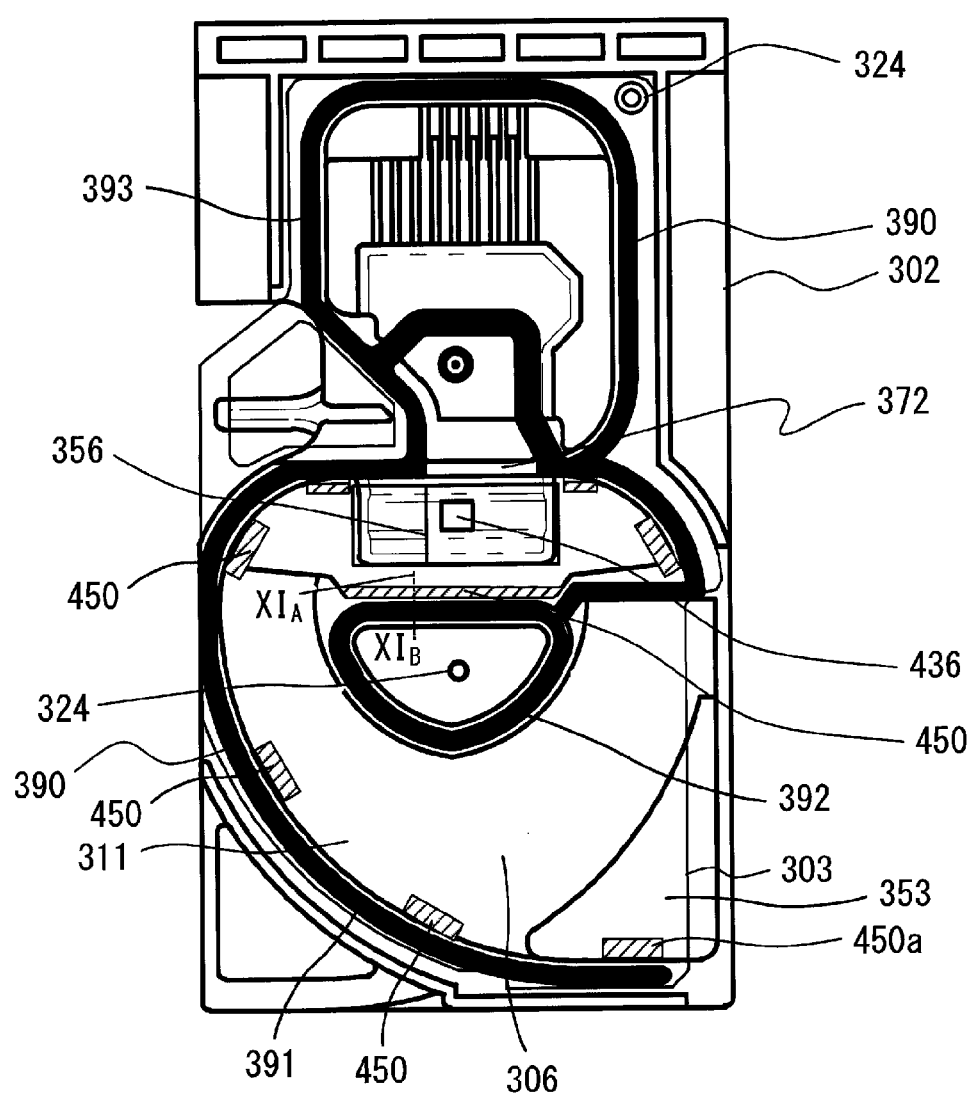
FIG. 14 is a plan view showing the arrangement and structure of the protruding portion for height control according to a fourth embodiment of the present invention.

FIG. 14 is a plan view showing the structure and arrangement of the protruding portions 450 for height control according to a fourth embodiment of the present invention.

In this fourth embodiment shown in FIG. 14, apart from the protruding portion 450 for height control that is provided between the lower end portion of the circuit package 400 and the upper end portion of the front side auxiliary passage internal side wall 392, there are also provided a plurality of protruding portions 450 for height control within the auxiliary passage recess 306, along the inner surface of the front side auxiliary passage external side wall 391.

The structure of the flow rate sensor 300 of the present invention is complicated, and, depending upon the material that is employed for the housing 302, there is a greater tendency for bending to take place at portions that correspond to the outlet 352 of the auxiliary passage recess 306 and/or the inlet 350 of the auxiliary passage recess 307, as compared to other spots. In other words, the difference (H1−H2) between the height H1 of the side wall 392 of the housing 302 and the height H2 of the protruding portion 450 for height control changes greatly depending upon the location.

In such a case, it may be beneficial to vary the heights H2 of the protruding portions 450 for height control at respective locations, as compared to the height of the protruding portion in the vicinity of the flow rate detection unit 436 for which the flatness is comparatively good. In other words, in FIG. 14, the height H2 of a protruding portion 450a for height control that is formed in the vicinity of the outlet recess 353 is lower than the heights H2 of the protruding portions 450 for height control in the vicinity of the flow rate detection unit 436. By making the heights H2 of the protruding portions 450 and 450a for height control different according to the degrees of bending at various locations upon the front and rear covers 303, 304 in this manner, and by thus adjusting the sinking amount of the laser welded portions 390, it is possible to anticipate improvement of the uniformity of the height of the auxiliary passage.

It should be understood that, in FIG. 14, an example is shown in which, among the protruding portions 450 for height control that are formed within the auxiliary passage recess 306 along the inner surface of the front side auxiliary passage external side wall 391, one that is closest to the outlet recess 353 is made as the protruding portion 450*a* for height control whose height is different from the heights of the others. However, it would also be acceptable to arrange for a plurality of the protruding portions 450 for height control that are close to the outlet recess 353 to be made as protruding portions 450*a* for height control whose heights are different from the heights of the others.

The other structures of this fourth embodiment are the same as in the case of the first embodiment, and accordingly the same reference symbols are appended to corresponding elements, and explanation thereof is omitted.

Similar advantageous effects are obtained in the case of this fourth embodiment as in the case of the first embodiment.

Embodiment #5

Figure 15:
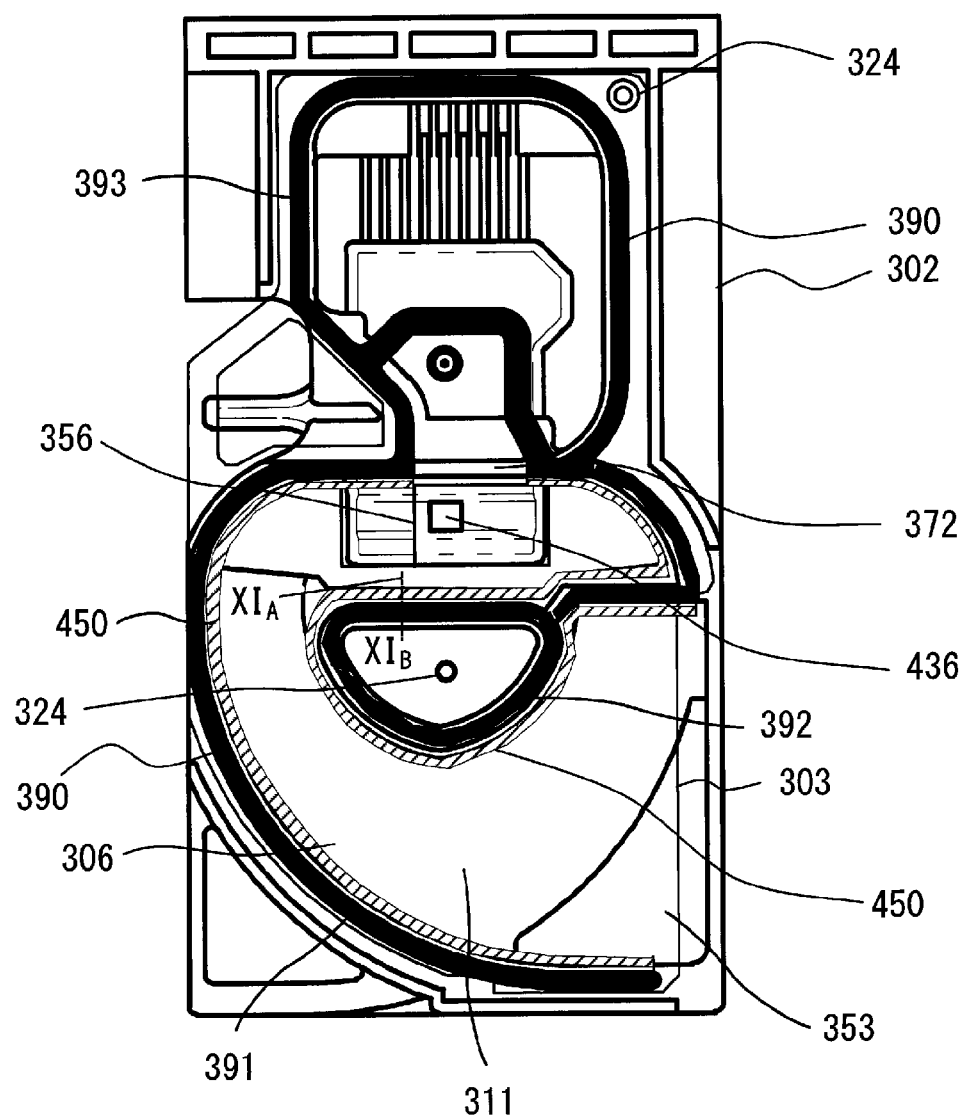
FIG. 15 is a plan view showing the arrangement and structure of the protruding portion for height control according to a fifth embodiment of the present invention.

FIG. 15 is a plan view showing the structure and arrangement of the protruding portions 450 for height control according to a fifth embodiment of the present invention.

In this fifth embodiment shown in FIG. 15, the protruding portion 450 for height control, apart from being provided between the lower end portion of the circuit package 400 and the upper end portion of the front side auxiliary passage internal side wall 392, also is provided continuously within the auxiliary passage recess 306, along the front side auxiliary passage external side wall 391 and the front side auxiliary passage internal side wall 392. This protruding portion 450 for height control that is thus formed continuously includes a portion that is formed between the lower end portion of the circuit package 400 and the upper end portion of the front side auxiliary passage internal side wall 392, as shown in the first through the fourth embodiment.

In this fifth embodiment as well, it would be acceptable to make the height H2 of the protruding portion 450 for height control change so that it gradually reduces or gradually increases.

The other structures of this fifth embodiment are the same as in the case of the first embodiment, and accordingly the same reference symbols are appended to corresponding elements, and explanation thereof is omitted.

It should be understood that it would also be possible to apply the arrangement and structure of the protruding portions 450 for height control on the front surface shown in the first through the fifth embodiment to the rear surface of the housing 302 as well.

Similar advantageous effects are obtained in the case of this fifth embodiment as in the case of the fourth embodiment.

Embodiment #6

Figure 16:
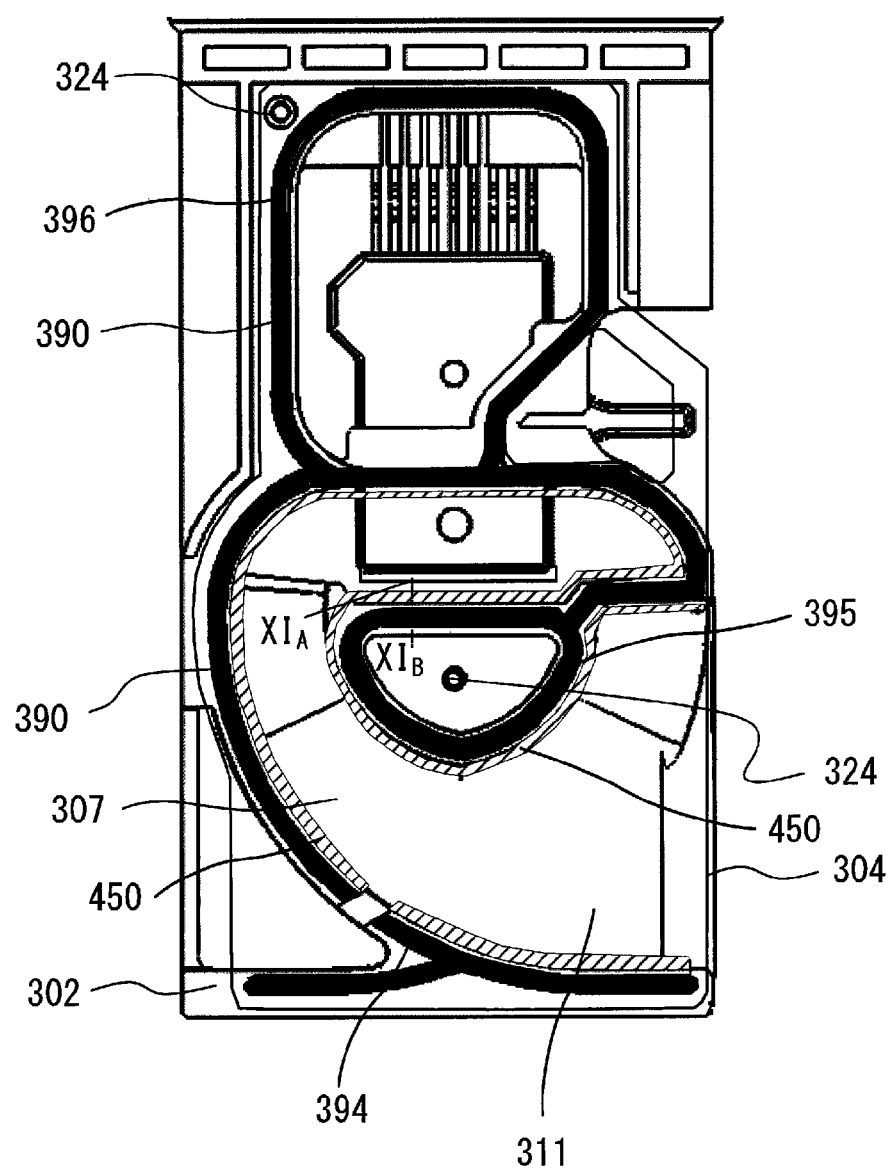
FIG. 16 is a plan view showing the arrangement and structure of the protruding portion for height control on the rear surface of the housing according to a sixth embodiment of the present invention.

FIG. 16 is a plan view showing the structure and arrangement of the protruding portions 450 for height control according to a sixth embodiment of the present invention. In this sixth embodiment shown in FIG. 16, there is shown an arrangement and structure of the protruding portion for height control on the rear surface of the housing 302.

With the flow rate sensor 300 shown in FIG. 16, the protruding portion 450 for height control is provided continuously within the auxiliary passage recess 307 along the rear side auxiliary passage external side wall 394 and the rear side auxiliary passage internal side wall 395. And this protruding portion 450 for height control that is formed continuously also is formed to pass through the region between the lower end portion of the circuit package 400 and the upper end portion of the rear side auxiliary passage internal side wall 395. It would also be acceptable to arrange to provide a plurality of protruding portions 450 for height control, separated from one another.

The other structures of this sixth embodiment are the same as in the case of the first embodiment, and accordingly the same reference symbols are appended to corresponding elements, and explanation thereof is omitted.

Similar advantageous effects are obtained in the case of this sixth embodiment as in the case of the first embodiment.

Embodiment #7

Figure 17A:
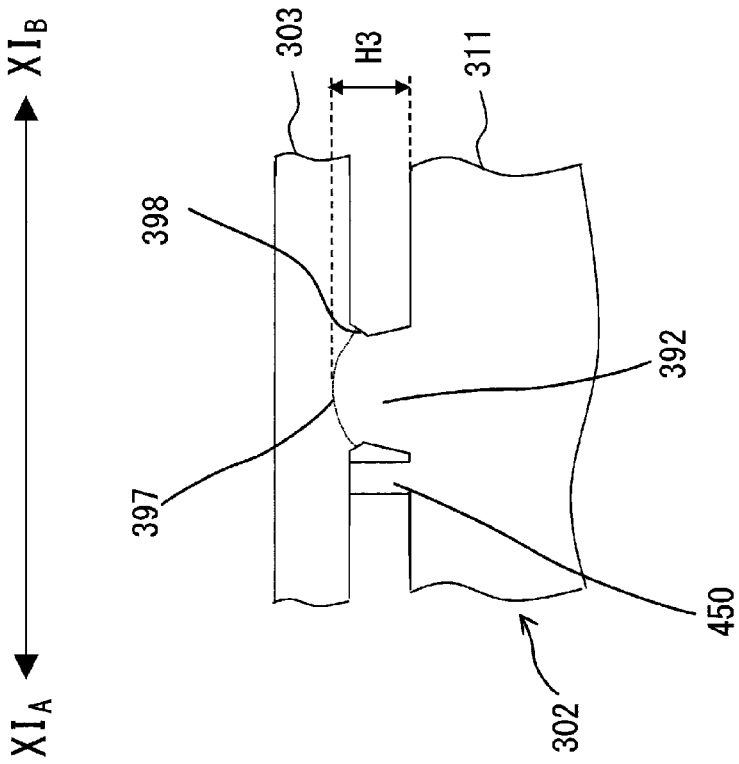
Figure 17B:
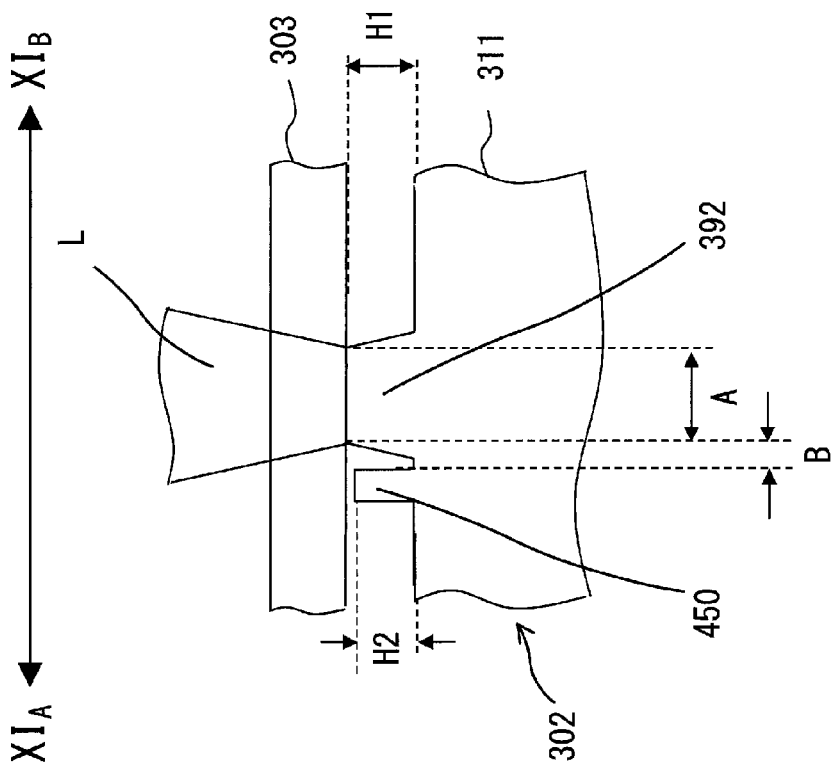
FIG. 17B is a sectional view after welding.

FIG. 17 shows figures related to laser welding of the housing and the front cover according to a seventh embodiment of the present invention: FIG. 17(A) is a sectional view thereof before welding, while FIG. 17(B) is a sectional view thereof after welding.

The flow rate sensor 300 of the first embodiment was configured such that the protruding portions 450 for height control were formed both upon the front cover 303 and upon the rear cover 304. By contrast, with the flow rate sensor 300 of this seventh embodiment, the protruding portions 450 for height control are formed upon the housing 302.

For laser welding, it is desirable for the transmittivity of both the front cover 303 and the rear cover 304 to be high. However, with a configuration in which both the front cover 303 and the rear cover 304 are formed to have protruding portions 450 for height control, the flow of resin at the peripheral parts of the protruding portions 450 for height control becomes stagnated, and in some cases also the transmittivity of the portions of the front and back covers 303, 304 that correspond to the laser welding also becomes deteriorated. Moreover, irregular variations are likely to occur. For example, in the case of a material such as PBT or PPS whose transmittivity is comparatively low, this type of phenomenon occurs prominently.

In such a case, as in this seventh embodiment shown in FIGS. 17(A) and 17(B), it is effective to make the front and rear covers 303, 304 to have a flat shape, and to provide the protruding portions 450 for height control upon the housing 302. By doing this, it is possible to avoid reduction of the transmittivity during formation of the front and rear covers 303, 304.

Furthermore, in this seventh embodiment, by irradiating with the laser light L a plurality of times at the region of the cover 303 that contacts the upper surface of the side wall 392, the upper side portion of the side wall 392 of the housing 302 is melted, so that it blends into the cover 303 as shown in FIG. 17(B). Moreover, the upper surface of the protruding portion 450 for height control that is formed upon the bottom base portion 311 of the housing 302 closely contacts against the inner surface of the cover 303.

Accordingly, similar advantageous effects are obtained in the case of this seventh embodiment as in the case of the first embodiment.

The other structures of this seventh embodiment are the same as in the case of the first embodiment, and accordingly the same reference symbols are appended to corresponding elements, and explanation thereof is omitted.

Embodiment #8

FIG. 18 shows figures related to laser welding of the housing and the front cover according to an eighth embodiment of the present invention: FIG. 18(A) is a sectional view thereof before welding, while FIG. 18(B) is a sectional view thereof after welding.

Also in this eighth embodiment shown in FIG. 18, in the same way as in the seventh embodiment, the protruding portion 450 for height control for the flow rate sensor 300 is formed upon the housing 302. The difference in features between this eighth embodiment and the seventh embodiment is that, in this eighth embodiment, a concave portion 308 is provided in the front and rear covers 303, 304 so as to receive the side wall 392 and the protruding portion 450 for height control. It should be understood that, in the following, the cover 303 is explained as being representative of both the front and rear covers 303, 304.

In this eighth embodiment, the concave portion 308 is formed on the inner surface of the cover 303. The concave portion 308 has an area that contains the side wall 392 and the protruding portion 450 for height control, and, before irradiation of the laser light L, the upper surface of the side wall 392 contacts against the bottom surface of the concave portion 308. The upper surface of the protruding portion 450 for height control is separated from the bottom surface of the concave portion 308. While, in FIG. 18, the side wall 392 and the protruding portion 450 for height control are formed with their side surfaces inclined, it would also be acceptable for these side surfaces not to be inclined surfaces.

In this eighth embodiment as well, by directing laser light L a plurality of times toward the cover 303 and at the region thereof that contacts the upper surface of the side wall 392, as shown in FIG. 18(B), the upper portion of the side wall 392 of the housing 302 becomes melted, and blends into the bottom part of the concave portion 308 of the cover 303. Moreover, the upper surface of the protruding portion 450 for height control that is formed upon the bottom base portion 311 of the housing 302 contacts closely against the bottom surface of the concave portion 308 of the cover 303. The depth of the concave portion 308 of the cover 303 is determined in consideration of the mechanical strength that is required for the cover 303. The thickness of the portion of the cover 303 where the concave portion 308 is formed may be set to, for example, 0.5 mm to 0.8 mm, although it depends upon the type of resin material employed.

In this eighth embodiment, since the thickness of the region of the cover 303 upon which the laser light L is directed becomes thinner by the depth of the concave portion 308, accordingly it is possible to make the transmittivity in this portion be greater than that of the portions surrounding it.

The relationship between the height H1 of the side wall 392 and the height H2 of the protruding portion 450 for height control, and the relationship between the width A of the side wall 392 and the distance B between the side wall 392 and the protruding portion 450 for height control, are the same as in the first embodiment.

It should be understood that, in the embodiment described above, an example was shown of a structure in which the concave portion 308 was provided upon the inner surface of the cover 303, or, to put it in another manner, upon the side of the cover 303 that faces the housing 302. However, it would also be acceptable to arrange to provide the concave portion 308 upon the outer surface of the cover 303, or to put it in another manner, upon the side upon which the laser light L is irradiated; or it would also be possible to provide concave portions 308 both upon the inner surface and upon the outer surface of the cover 303.

The other structures of this eighth embodiment are the same as in the case of the first embodiment, and accordingly the same reference symbols are appended to corresponding elements, and explanation thereof is omitted.

Similar advantageous effects are obtained in the case of this eighth embodiment as in the case of the first embodiment.

Inspection of the External Appearance of the Laser Welded Portions

A method will now be explained for checking, by inspecting the external appearance, whether or not the cover 303 and the side walls 391 through 396 of the housing 302 have been securely welded together by laser welding.

After the upper surfaces of the side walls 391 through 396 of the housing 302 and the front and rear covers 303, 304 have been laser welded together, the portions that have been welded are photographed with a camera, and it is determined from the image whether or not the upper surfaces of the side walls 391 through 396 and the front cover 303 have been welded. Since the front and rear covers 303, 304 are made from a light transmissive resin while the housing 302 is made from a light absorbent resin, accordingly the luminance of the parts where laser welding has been performed properly will have become lower. If a gap is present between the upper surface of the side wall 392 and the cover 303, then the luminance of this portion will have become higher. Thus, if the laser welding has been performed properly, then the contrast will be almost the same along the entire length of the laser welded portions 390. However, the contrast will not be the same along the entire length of the laser welded portions 390 if there is some spot that is not laser welded properly, and therefore, it is possible to detect any spot that is not sufficiently welded.

As a result of investigating the transmittivity of the front and rear covers 303, 304 that is needed for this external appearance inspection, it has been determined that, if for example PBT resin is used, it is acceptable for the average transmittivity of the front and rear covers 303, 304 in the wavelength region of 450 to 1100 nm to be 32% to 33% or greater. Even when errors of various types are considered, the average transmittivity of 35% or greater is sufficient.

As another index corresponding to the average transmittivity, it is also possible to refer to the L*a*b* color system according to the JIS Z 8729 standard, in which the color of a body is expressed numerically.

The lightness L* and the chroma $C^*=[(a^*)^2+(b^*)^2]^{1/2}$ of the resin material of the cover 303 are to be measured and determined according to the L*a*b* color system. It has been confirmed that, if the color of the laser welded portions on the front and rear covers 303, 304 has the lightness L*<75 and the chroma C*<10, it is equivalent to the state in which the average transmittivity in the wavelength region of 450 to 1100 nm is 35% or greater.

If, in the first through the eighth embodiments, a resin material of the transmittivity, the lightness L* and the saturation C* described above is employed for the front and rear covers 303, 304, then external appearance inspection can be performed by using image processing.

Since normally the transmittivity of crystalline resin is low, it is effective to employ a transparent amorphous thermoplastic resin as an alloy material in order to increase the transmittivity of the resin material of the front and rear covers 303, 304. It is necessary to leave the color as natural color. By employing a transparent amorphous thermoplastic resin, and in particular by employing the structure shown in FIG. 18, not only is it possible to perform inspection of the welded state of the laser welded portions by their external appearance, but also it becomes possible to examine the close contacting of the protruding portions 450 for height control against the front and rear covers 303, 304 by their external appearance.

However, if the contacting force of the protruding portions 450 for height control against the front and rear covers 303, 304 is small, then in some cases it is difficult to obtain the contrast (the black to white difference from different locations) that is needed for external appearance inspection.

An embodiment will now be described in which the contrast of the laser welded portions is made greater.

Embodiment #9

Figure 19:
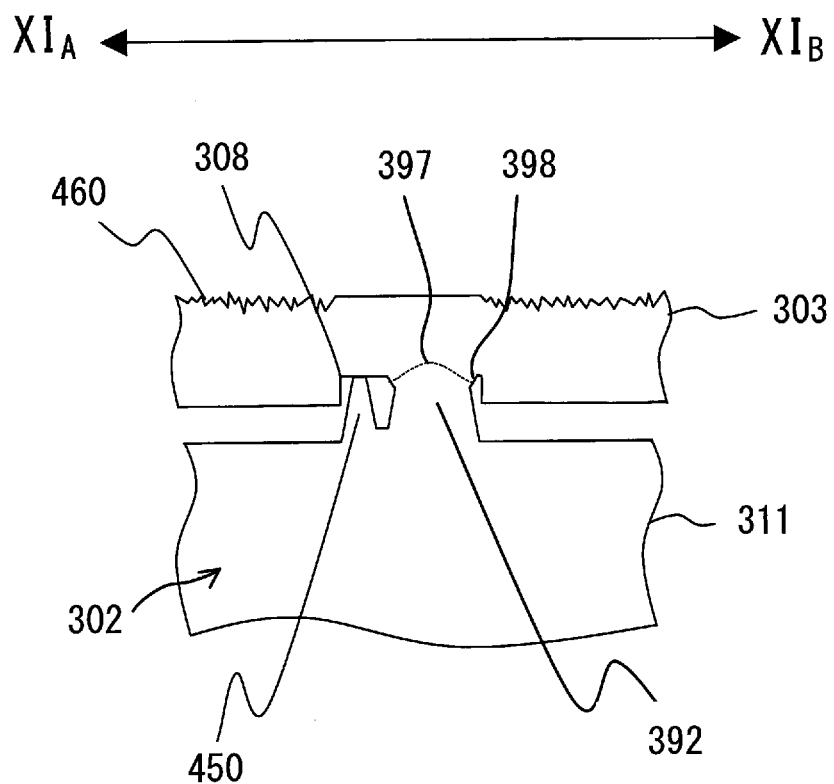
FIG. 19 is a sectional view of the housing and the front cover after laser welding according to a ninth embodiment of the present invention.

FIG. 19 is a sectional view of the housing and the front cover after welding with laser light according to a ninth embodiment of the present invention.

With this ninth embodiment shown in FIG. 19, the difference in features from the eighth embodiment is that fine irregularities 460 are formed upon the surface of the cover 303 upon which the laser light L is directed.

These fine irregularities 460 are not formed upon a region which is in the approximately same position and moreover has approximately the same area as the concave portion 308 that receives the side wall 392 and the protruding portion 450 for height control. In other words, the fine irregularities 460 are not formed upon the region of the cover 303 from the upper surface of the side wall 392 to the upper surface of the protruding portion 450 for height control. Since the laser light L is reflected by the portion of the cover 303 upon which the fine irregularities 460 are formed, accordingly it is possible to increase the contrast with the region upon which the fine irregularities 460 are not formed.

The other structures of this ninth embodiment are the same as in the case of the eighth embodiment, and accordingly the same reference symbols are appended to corresponding elements, and explanation thereof is omitted.

Similar advantageous effects are obtained in the case of this ninth embodiment as in the case of the eighth embodiment.

Embodiment #10

Figure 20:
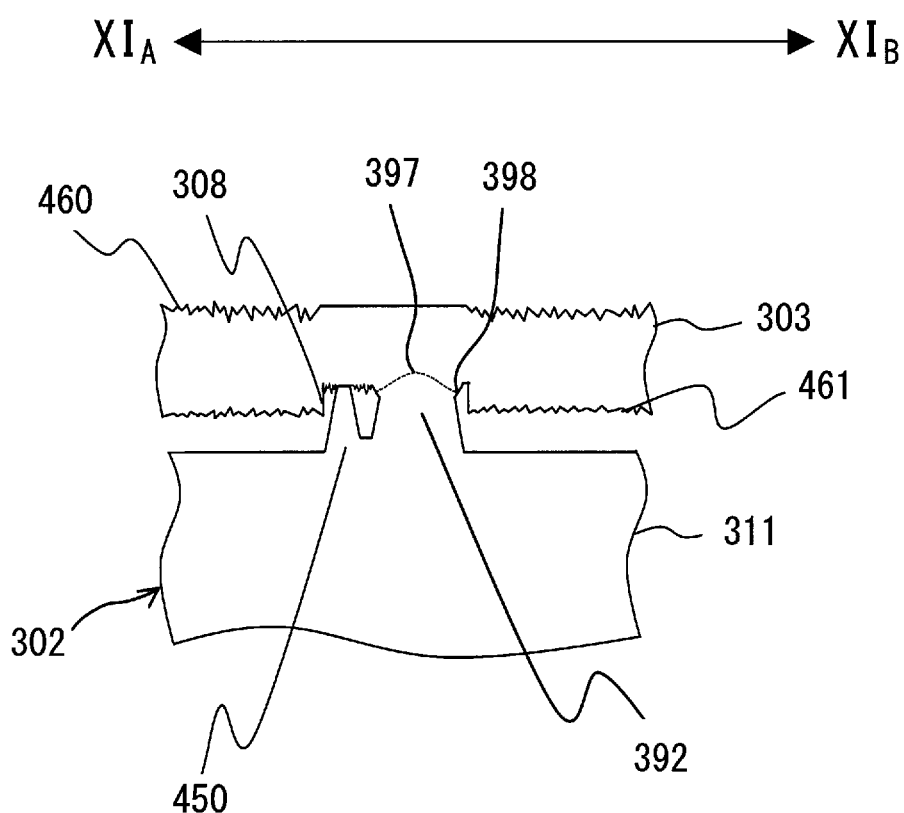
FIG. 20 is a sectional view of the housing and the front cover after laser welding according to a tenth embodiment of the present invention.

FIG. 20 is a sectional view of the housing and the front cover after laser welding according to a tenth embodiment of the present invention.

In this tenth embodiment shown in FIG. 20, the difference in features from the ninth embodiment is that fine irregularities 461 are also formed upon the inner surface of the cover 303, or, to put it in another manner, upon the side of the cover 303 that faces the housing 302.

These fine irregularities 461 are not only formed outside the concave portion 308, but are also formed upon the bottom surface of the concave portion 308.

However, within the concave portion 308, no fine irregularities 461 are formed upon the portions that correspond to the upper surface of the side wall 392 and to the protruding portion 450 for height control, so that no obstacle to the laser welding arises. According to this tenth embodiment, it is possible further to enhance the difference in contrast between the upper surface of the side wall 392 and the upper surface of the protruding portion 450 for height control, and their surroundings.

It should be understood that the fine irregularities 461 that are formed, before the laser welding, upon the bottom surface of the concave portion 308 of the cover 303 on the side to be laser welded causes the transmittivity of the cover 303 to be reduced. Moreover, the laser light L is scattered by the fine irregularities 461. However since, within the concave portion 308, the side wall 392 and the protruding portion 450 for height control are separated from one another, and there is only a gap between the portion where scattering occurs during laser application and the welded portions, accordingly the influence due to scattering of the laser light L is small, and light loss does not become a problem. Moreover, by the welding, the resin material of the cover 303 and the resin material of the housing 302 are melted, and blend together. Due to this, the refractive index difference disappears after the welding, and there is no great difference in the transmittivity of the portions of the cover 303 that correspond to the laser welded portions 390, as compared with before the welding.

The other structures of this tenth embodiment are the same as in the case of the ninth embodiment, and accordingly the same reference symbols are appended to corresponding elements, and explanation thereof is omitted. And similar advantageous effects are obtained in the case of this tenth embodiment as in the case of the first embodiment.

Embodiment #11

Figure 21:
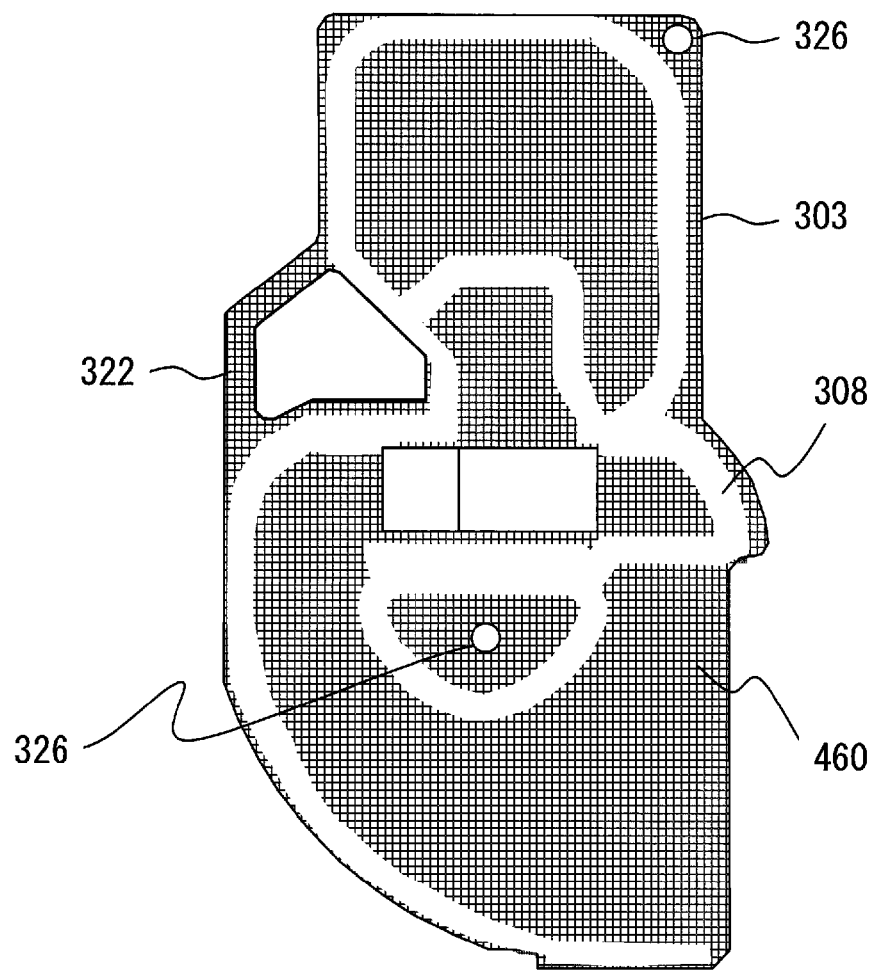
FIG. 21 is a plan view for explanation of fine irregularities that are provided upon portions of the front cover other than the laser welded portions thereof according to an eleventh embodiment of the present invention.

FIG. 21 is a plan view for explanation of fine irregularities that are provided upon portions of the front cover other than the laser welded portions 390 according to an eleventh embodiment of the present invention.

In FIG. 21, the fine irregularities 460 shown in FIG. 19 are formed over the entire front surface of the cover 303, except for the regions that correspond to the concave portion 308. By doing this, not only is it possible to increase the contrast difference for external appearance inspection, but also it is possible to make damage or the like caused during transport and so on less conspicuous.

Along with forming the fine irregularities 460 on the front surface of the cover 303, it would also be acceptable to arrange to form fine irregularities 461 on the inner surface of the cover 303, as shown in FIG. 20.

The fine irregularities 460, 461 may be formed during injection molding by providing grain in the mold, or may be formed separately by applying blast processing to the cover 303 or the like. It is desirable for the surface roughness Ra of these fine irregularities 460, 461 to be of the order of 0.6 to 3.0 μm.

Embodiment #12

FIG. 22 is a sectional view of the housing and the front cover after laser welding according to a twelfth embodiment of the present invention.

The feature by which the twelfth embodiment shown in FIG. 22 differs from the eleventh embodiment is that, within the region upon the front surface of the cover 303 over which no fine irregularities 460 are formed, a concave portion 309 is provided in an area that corresponds to the upper surface of the protruding portion 450 for height control.

By providing this concave portion 309 in the area that corresponds to the upper surface of the protruding portion 450 for height control, this portion of the cover 303 becomes thinner, and the transmittivity of this portion becomes greater than that of the laser welded portions 390. Due to this, the contrast between the protruding portion 450 for height control and the laser welded portion becomes high.

When inspecting an image all together, in some cases, it is better to make the contrast between the laser welded portion 390 and the closely contacted portion of the protruding portion 450 for height control against the cover 303 small. In another case, depending upon the type of resin that is employed, it is desired to increase only the contrast between the closely contacted portion of the protruding portion 450 for height control against the cover 303 and its surroundings. In order to achieve this, as shown in FIG. 22, the concave portion 309 may be provided on the laser irradiation side of the portion corresponding to the closely contacted portion between the protruding portion 450 for height control and the cover 303.

The other structures of this twelfth embodiment are the same as in the case of the tenth embodiment, and accordingly the same reference symbols are appended to corresponding elements, and explanation thereof is omitted.

Similar advantageous effects are obtained in the case of this twelfth embodiment as in the case of the first embodiment.

The Resin Material

Next, an explanation will be provided relating to the resin material employed for the housing 302 and for the front and rear covers 303, 304.

When the flow rate sensor 300 is used over the long term, deformation of the housing 302 and the front and rear covers 303, 304 takes place, and the characteristics of the passage change, so that irregular variations in flow rate detection become large. Since the front and rear covers 303, 304 and the housing 302 are welded together, accordingly the influence that the housing 302 with higher rigidity exerts is great in terms of deformation. Due to this, it is necessary to make the heat resistance of the alloy material contained in the housing 302 higher than that of the alloy material contained in the front and rear covers 303, 304.

In other words, it is desirable for the following condition to be satisfied:

The glass transition temperature of the alloy material contained in the housing 302≥the glass transition temperature of the alloy material contained in the front and rear covers 303, 304

The same holds for the modulus of elasticity. It is desirable for the following condition to be satisfied:

The modulus of elasticity of the thermoplastic resin from which the housing 302 is made>the modulus of elasticity of the thermoplastic resin from which the front and rear covers 303, 304 are made While the influence of the front and rear covers 303, 304 is small as compared to that of the housing 302, the characteristics also fluctuate due to use over the long term. In particular, the proportion of the influence of the front cover 303 upon the characteristic fluctuations, which is the one that is arranged to face the flow rate detection unit 436, is higher than that of the rear cover 304. Thus attention is directed to the fact that polymer materials whose degree of crystallinity is high also have high rigidity, high strength, and high heat resistance, and accordingly, for the front cover 303 and the rear cover 304, it is arranged for the following condition in relation to the degree of crystallinity to be satisfied:

The degree of crystallinity of the front cover 303>the degree of crystallinity of the rear cover 304

In the above description, the meaning of "degree of crystallinity" is as follows: in a state that is a mixture of the crystalline state in which the polymer molecules are regularly arranged and the amorphous state in which the polymer molecules are entangled together, the proportion of crystalline portions is termed the "degree of crystallinity"; in other words, the (degree of crystallinity) is defined as being equal to (the portion consisting of crystalline regions)÷(the portion consisting of crystalline regions and the portion consisting of amorphous regions).

Furthermore, in relation to the glass transition temperatures of the front cover 303 and the rear cover 304, it is desirable for the following condition to be satisfied:

The glass transition temperature of the alloy material included in the front cover 303>the glass transition temperature of the alloy material included in the rear cover 304

If an inorganic material, for example glass fiber, glass flakes, glass of some special shape or the like, is added to a polymer material, then it is possible to enhance the dimensional stability during molding and against long term change. The amount of such inorganic material that is added is normally around 20% to 50%. However, when the amount of inorganic material such as glass material or the like is increased, the transparency to the laser light L becomes worse. Accordingly it is appropriate for the amount of inorganic material that is added to the front and rear covers 303, 304 to be around 20% to 30%, in consideration of the dimensional stability and also the transparency to laser light.

Normally, for laser welding, a colorant such as carbon black or the like is mixed into the resin material for the housing 302. Therefore, it is not necessary to take any consideration in relation to change of color, transmittivity, or hue of the resin material for the housing 302. However, it is necessary to keep the amount of deformation of the housing 302 small over the long term, as compared to the front and rear covers 303, 304.

Thus, in relation to the inorganic material added to the housing 302 and the front and rear covers 303, 304, it is desirable for the following condition to be satisfied:

The proportion of inorganic material added to the thermoplastic resin of which the housing 302 is made≥the proportion of inorganic material added to the thermoplastic resin of which the covers 303, 304 are made.

With a crystalline thermoplastic resin, from the standpoint of preventing deformation over the long term, the lower the mold temperature is during molding, the lower is the degree of crystallinity, and moreover the higher is the transmittivity. Due to this, it is beneficial to employ a low mold temperature for the resin material of the front and rear covers 303, 304, so as to satisfy the conditions for transmittivity and hue. On the other hand it is desirable for the degree of crystallinity of the resin material of the housing 302 to be high, since, the higher is the degree of crystallinity, the better the dimensional stability is enhanced.

Accordingly, in relation to the degree of crystallinity of the housing 302 and the front and rear covers 303, 304, it is desirable for the following condition to be satisfied:

The degree of crystallinity of the thermoplastic material of which the housing 302 is made>the degree of crystallinity of the thermoplastic material of which the covers 303, 304 are made.

Additives of various types may be added to the crystalline resins of which the front and rear covers 303, 304 and the housing 302 are made, such as, for example, an antioxidant, an ultraviolet absorber, a heat stabilizer, a surfactant, lubricant, a crystallization nucleus, a fire retardant, or the like. However, as much as possible, it is desirable not to add any material to the front and rear covers 303, 304 that may exert an influence upon reduction of optical transmittivity. On the other hand, it is desirable to add a colorant to the housing 302 that absorbs the laser light L, for example carbon black or the like.

For the laser welding of the front and rear covers 303, 304 and the housing 302, it is desirable that the resin materials of the front and rear covers 303, 304 and of the housing 302 should not include any release agent.

As an amorphous resin alloy material to be added to the crystalline resin of which the front and rear covers 303, 304 are manufactured, for example, polystyrene (PS), acrylonitrile-styrene (AS), acrylonitrile-butadiene-styrene copolymer (ABS), poly(methyl methacrylate) (PMMA), cyclo-olefin polymer (COP), cyclo-olefin copolymer (COC), polyvinyl chloride (PVC), polycarbonate (PC), or the like may be used.

As an amorphous resin alloy material to be added to the crystalline resin of which the housing 302 is manufactured, apart from the alloy material that is added to the front and rear covers 303, 304, also modified polyphenylene ether (mPPE), polyetherimide (PEI), polyarylate (PAR), polysulfone (PSF), polyether sulfone (PES), or the like whose glass transition temperatures are higher may be considered.

While it is desirable to add at least one type of alloy material to the front and rear covers 303, 304 as amorphous resin, it would also be acceptable to add, not only that one type of alloy material, but also, in addition thereto, an alloy material containing crystals of some other type. The same holds for the housing 302.

As has been explained, in the embodiments described above, the side walls 391 through 396 for constituting the auxiliary passage to the flow rate detection unit 436 are formed upon the front and rear surfaces of the housing 302, and the front and rear covers 303, 304 are welded to the upper surfaces of these side walls 391 through 396 with laser welding. Moreover, the protruding portion 450 for height control for suppressing sinking in of the housing or the cover during welding is provided to one of the housing 302, and the front and rear covers 303, 304.

Due to this, according to the various embodiments of the present invention, it is possible to eliminate the adhesive hardening time period when an adhesive is used for joining and also to eliminate the cost of the adhesive, so that it is possible to anticipate increase in the efficiency of joining and reduction of the cost thereof; and, moreover, along therewith, it is also possible to prevent sinking in of the cover 303 and to reduce irregular variations in flow rate detection.

It should be understood that, in the embodiments described above, examples have been shown in which the front and rear covers 303, 304 and the housing 302 were welded together with laser welding. However, the present invention is not only applicable to the case of laser welding; it can also be applied to cases in which other types of welding are employed, such as thermal welding, vibration welding, ultrasonic welding or the like.

Furthermore, the present invention can also be used for application to a product other than the above described heat type flow rate sensor 300; in fact, the present invention can be applied to any product that is manufactured from thermoplastic resin. Apart from the types of thermoplastic resin detailed above, it would also be possible to utilize polyethylene (PE), polypropylene (PP), polyoxymethylene (POM), polyethylene terephthalate (PET), polytrimethylene terephthalate (PTT), polyethylene naphthalate (PEN), polyether ether ketone (PEEK), a liquid crystal polymer (LCP), or polytetrafluoroethylene (PTFE).

Furthermore, it would also be possible to employ the thermoplastic resin described above as an amorphous thermoplastic resin alloy material. Along with such alloy material, a thermoplastic resin including a special type of additive such as an inorganic material like glass fiber or the like could also be applied. Moreover, not only is it possible to employ a thermoplastic resin as the main material, but also it is possible to employ a thermosetting resin whose optical transmittivity is comparatively high, such as an epoxy type resin or an acrylic type resin or the like.

Within the scope of the concept of the present invention, portions of the first through twelfth embodiments described above can be applied with variations. Moreover, it would also be acceptable to combine together portions of the first through twelfth embodiments described above.

Essentially, in a flow rate sensor in which a cover is welded to the upper surface of a side wall that is provided to a housing, it will suffice if a protruding portion for height control for preventing sinking in of the cover during welding is provided to one of the housing and the cover, at least in the neighborhood of the side wall at the surroundings of a flow rate detection unit that is housed within the housing.

The content of the disclosure of the following priority application is hereby incorporated herein by reference:

Japanese Patent Application No. 2013-235867 (filed on Nov. 14, 2013).

REFERENCE SIGNS LIST

300: flow rate sensor
301: casing
302: housing
303: front cover (cover)
304: rear cover
306, 307: auxiliary passage recesses
308, 309: concave portions
310: measurement unit
311: bottom base portion
322: protective portion
350: inlet
351: inlet recess
352: outlet
353: outlet recess
356: throttling portion
372: slit
376: fixing portion
380, 381: projecting portions
382: cavity portion
390: laser welded portion
391: front side auxiliary passage external side wall
392: front side auxiliary passage internal side wall (side wall)
393: front side upper side wall portion
394: rear side auxiliary passage external side wall
395: rear side auxiliary passage internal side wall
396: rear side upper side wall portion
397: penetration boundary surface
398: resin burr
400: circuit package
430: flow conduit surface for measurement
436: flow rate detection unit
450, 450a: protruding portion for height control
452: temperature detection unit
460, 461: fine irregularities
602: flow rate detection element

The invention claimed is:

1. A flow rate sensor, comprising:
a housing made from a resin material and having a bottom base portion and a side wall, at least one surface side of the housing being open;
a cover made from a resin material, covering the one surface side of the housing, welded to an upper surface of the side wall of the housing, and defining, with the bottom base portion and the side wall of the housing, an auxiliary passage within which a gas to be measured flows that is taken in from a main passage;

a flow rate detection unit disposed within the auxiliary passage; and a throttling portion provided, facing the flow rate detection unit, on the cover within the auxiliary passage; wherein:

a protruding portion for height control is provided to the housing and the cover at least in a vicinity of the side wall around the flow rate detection unit so as to suppress sinking in of the cover during welding; and the throttling portion has a triangular shape formed with a sloping surface toward an upstream side of the auxiliary passage that is more gently inclined than a sloping surface toward a downstream side of the auxiliary passage.

2. The flow rate sensor according to claim 1, wherein:
the flow rate detection unit is constituted as a circuit package that comprises a plate and a flow rate detection element mounted upon the plate; and
the protruding portion for height control is provided between at least one end portion of the circuit package and a portion of the side wall that opposes the one end portion of the circuit package.

3. The flow rate sensor according to claim 2, wherein:
the circuit package is formed integrally with the housing by insert molding; and
the protruding portion for height control is formed at a plurality of spots in surroundings of the one end portion of the circuit package.

4. The flow rate sensor according to claim 3, wherein:
the protruding portion for height control is provided at least at three spots in the surroundings of the one end portion of the circuit package.

5. The flow rate sensor according to claim 2, wherein:
the auxiliary passage has a cavity portion that is formed by the bottom base portion being cut away at surroundings of the circuit package; and
the protruding portion for height control is provided continuously along a portion of a circumference of the cavity portion.

6. The flow rate sensor according to claim 1, wherein:
the cover comprises a front cover that covers the one surface side of the housing and a rear cover that covers another surface side of the housing; and
the protruding portion for height control is provided upon one of the front cover and the housing, and upon one of the rear cover and the housing.

7. The flow rate sensor according to claim 6, wherein:
a flow conduit surface for measurement that contacts the gas to be measured is provided in the flow rate detection unit on a side facing the front cover, and the resin material from which the front cover is made includes an alloy material whose glass transition temperature is higher than a glass transition temperature of an alloy material that is included in the resin material from which the rear cover is made.

8. The flow rate sensor according to claim 1, wherein:
the flow rate detection unit is constituted as a circuit package that comprises a plate and a flow rate detection element mounted upon the plate;
the auxiliary passage has a cavity portion that is formed by the bottom base portion being cut away at surroundings of the circuit package;

the side wall comprises a curved portion between an inlet at which the gas to be measured is taken in or an outlet at which the gas to be measured is discharged and the cavity portion; and the protruding portion for height control is further provided at the curved portion of the side wall.

9. The flow rate sensor according to claim 8, wherein:
the protruding portion for height control is provided continuously along the curved portion of the side wall.

10. The flow rate sensor according to claim 8, wherein:
a plurality of protruding portions for height control, each of which is identical to the protruding portion for height control, are provided at the curved portion of the side wall; and
at least one of the plurality of the protruding portions for height control that are provided at the curved portion of the side wall is formed to be of a height that is different from a height of another protruding portion for height control that is provided at the curved portion of the side wall, or from a height of the protruding portion for height control that is provided at the circumference of the cavity portion.

11. The flow rate sensor according to claim 1, wherein:
the protruding portion for height control is disposed so that a gap is left open between the protruding portion and a resin burr that is formed when the cover and the side wall are welded together.

12. The flow rate sensor according to claim 1, wherein:
the protruding portion for height control is set to a position that is lower than a penetration boundary surface of the housing and the cover.

13. The flow rate sensor according to claim 1, wherein:
the protruding portion for height control is provided to the housing; and
a concave portion that contains the side wall and the protruding portion for height control is formed on the cover.

14. The flow rate sensor according to claim 1, wherein:
around a welded portion of the cover, irregularities having a surface roughness greater than a surface roughness of the welded portion of the cover are formed.

15. The flow rate sensor according to claim 1, wherein:
in the cover, at least a portion facing a welded portion to the side wall and a portion facing the protruding portion for height control have an average transmittivity of 35% or greater with respect to light of wavelength between 450 nm through 1100 nm.

16. The flow rate sensor according to claim 1, wherein:
in the cover, at least a portion facing a welded portion to the side wall and a portion facing the protruding portion for height control have lightness L* less than or equal to 75 and chroma C* less than or equal to 10 in L*a*b* color system.

17. The flow rate sensor according to claim 1, wherein:
the cover is formed from a crystalline resin, and contains an amorphous alloy material.

18. The flow rate sensor according to claim 1, wherein:
the cover and the housing are formed from a resin material that includes an alloy material, and a glass transition temperature of the alloy material included in the housing is higher than a glass transition temperature of the alloy material included in the cover.

19. The flow rate sensor according to claim 1, wherein:
the resin material of the cover includes a glass material, wherein an amount of the glass material is less than or equal to an amount of a glass material included in the resin material of the housing.

20. The flow rate sensor according to claim 1, wherein:
a degree of crystallinity of the resin material of which the housing is made is higher than a degree of crystallinity of the resin material of which the cover is made.

\* \* \* \* \*